(12) United States Patent
Chung et al.

(10) Patent No.: US 12,538,493 B2
(45) Date of Patent: Jan. 27, 2026

(54) MEMORY DEVICE AND METHOD OF MANUFACTURING MEMORY DEVICE

(71) Applicant: SK hynix Inc., Icheon-si (KR)

(72) Inventors: Sung Yong Chung, Icheon-si (KR); Nam Kuk Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 745 days.

(21) Appl. No.: 17/742,229

(22) Filed: May 11, 2022

(65) Prior Publication Data

US 2023/0180480 A1    Jun. 8, 2023

(30) Foreign Application Priority Data

Dec. 8, 2021    (KR) .................. 10-2021-0175082

(51) Int. Cl.
| | |
|---|---|
| H10B 43/50 | (2023.01) |
| H01L 23/00 | (2006.01) |
| H01L 25/00 | (2006.01) |
| H01L 25/065 | (2023.01) |
| H01L 25/18 | (2023.01) |
| H10B 43/27 | (2023.01) |

(52) U.S. Cl.
CPC ............. *H10B 43/50* (2023.02); *H01L 24/08* (2013.01); *H01L 24/80* (2013.01); *H01L 25/0657* (2013.01); *H01L 25/18* (2013.01); *H01L 25/50* (2013.01); *H10B 43/27* (2023.02); *H01L 2224/08145* (2013.01); *H01L 2224/80006* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ........ H10B 43/50; H10B 43/27; H10B 43/35; H10B 43/40; H01L 24/08; H01L 24/80; H01L 25/0657; H01L 25/18; H01L 25/50; H01L 2224/08145; H01L 2224/80006; H01L 2224/80895; H01L 2224/80896; H01L 2924/1431; H01L 2924/14511; H01L 2225/06527; H01L 2225/06541; H01L 2225/06544
See application file for complete search history.

(56) References Cited

U.S. PATENT DOCUMENTS

| | | | |
|---|---|---|---|
| 2020/0251488 A1 | 8/2020 | Iwai et al. | |
| 2023/0016518 A1* | 1/2023 | Lien | .................. G11C 16/24 |

FOREIGN PATENT DOCUMENTS

| | | |
|---|---|---|
| KR | 1020170003835 A | 1/2017 |
| KR | 1020180074876 A | 7/2018 |
| KR | 1020210092090 A | 7/2021 |
| KR | 1020210129366 A | 10/2021 |

* cited by examiner

*Primary Examiner* — Thanh T Nguyen
(74) *Attorney, Agent, or Firm* — WILLIAM PARK AND ASSOCIATES LTD.

(57) ABSTRACT

The present discloses includes a memory device including a first vertical plug and a second vertical plug that are arranged to be adjacent to each other, a first select line contacting the first vertical plug, a second select line over a same layer as the first select line and contacting the second vertical plug, and an isolation pattern overlapping with a portion of the first vertical plug and a portion of the second vertical plug and separating the first select line from the second select line.

20 Claims, 27 Drawing Sheets

MEMORY DEVICE AND METHOD OF MANUFACTURING MEMORY DEVICE

CROSS-REFERENCE TO RELATED APPLICATION

The present application claims priority under 35 U.S.C. § 119(a) to Korean patent application number 10-2021-0175082 filed on Dec. 8, 2021, in the Korean Intellectual Property Office, the entire disclosure of which is incorporated by reference herein.

BACKGROUND

1. Technical Field

Various embodiments relate generally to a memory device and a method of manufacturing the memory device, and more particularly, to a memory device having a three-dimensional structure and a method of manufacturing the memory device.

2. Related Art

Memory devices may be classified into a volatile memory device losing the stored data when power supply is blocked and a non-volatile memory device retaining the stored data even when power supply is blocked.

A non-volatile memory device may include NAND flash memory, NOR flash memory, resistive random access memory (ReRAM), phase-change random access memory (PRAM), magneto resistive random access memory (MRAM), ferroelectric random access memory (FRAM), and spin transfer torque random access memory (STT-RAM).

Among the above memories, memory cells that are included in a NAND flash memory may be included in a string coupled between a bit line and a source line. The string may include first select transistors, memory cells, and second select transistors that are coupled between the bit line and the source line. Gates of the first select transistors may be coupled to first select lines. Gates of the memory cells may be coupled to word lines. Gates of the second select transistors may be coupled to second select lines.

SUMMARY

According to an embodiment, a memory device may include a first vertical plug and a second vertical plug that are arranged to be adjacent to each other, a first select line contacting the first vertical plug, a second select line over a same layer as the first select line and contacting the second vertical plug, and an isolation pattern overlapping with a portion of the first vertical plug and a portion of the second vertical plug and separating the first select line from the second select line.

According to an embodiment, a memory device may include a source line, first select lines, word lines, and a second select line stacked over a substrate, a first vertical plug and a second vertical plugs vertically passing through the first select lines, the word lines, and the second select line, and spaced apart from each other, and an isolation pattern between the first and second vertical plugs, overlapping with portions of the first and second vertical plugs and separating the first select lines in a vertical direction.

According to an embodiment, a memory device may include a peripheral circuit structure over a substrate, a cell structure contacting the peripheral circuit structure through bonding pads, and including a bit line, first select lines, word lines, second select lines, and a source line, a first vertical plug and a second vertical plug vertically penetrating the cell structure and spaced apart from each other, a first isolation pattern overlapping with portions of the first and second vertical plugs under the pluralities of first and second vertical plugs, and separating each of the first select lines in a vertical direction, and a second isolation pattern overlapping with portions of the pluralities of first and second vertical plugs over the pluralities of first and second vertical plugs, and separating each of the second select lines that are on a different plane than the first select lines in the vertical direction.

According to an embodiment, a method of manufacturing a memory device may include forming a stacked structure in which a first select line, word lines, and a second select line are stacked on a source line, forming a first vertical plug and a second vertical plug that vertically pass through the first select line, the word lines, and the second select line, and spaced apart from each other, forming a trench that overlaps with portions of the first and second vertical plugs and separating the first select line from the second select line, and forming an isolation pattern in the trench.

According to an embodiment, a method of manufacturing a memory device may include forming a peripheral circuit structure in which a first bonding pad is exposed on a first substrate, forming a cell structure in which a first select line, word lines, a second select line, and a second bonding pad are stacked on a second substrate, forming a first vertical plug and a second vertical plug vertically passing through the first select line, the word lines, and the second select line that are included in the cell structure, the first and second vertical plugs spaced apart from each other, forming a first trench overlapping with portions of the first and second vertical plugs and separating the second select line, forming a first isolation pattern in the first trench, turning over the cell structure and the second substrate, and bonding the second bonding pad that is included in the cell structure to the first bonding pad that is included in the peripheral circuit structure, removing the second substrate, forming a second trench overlapping with portions of the first and second vertical plugs and separating the first select line, and forming a second isolation pattern in the second trench.

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Various embodiments are directed to a memory device in which an isolation pattern for separating select lines is formed without causing loss of vertical plugs, and a method of manufacturing the memory device.

Figure 1:
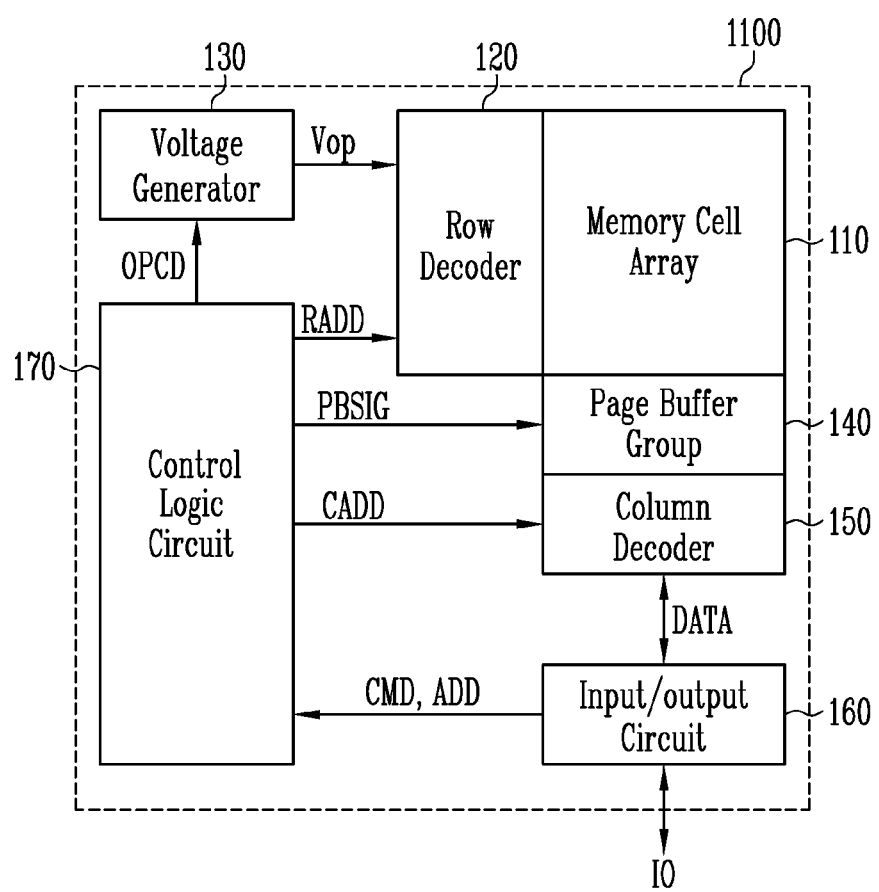
FIG. 1 is a diagram illustrating a memory device according to an embodiment of the present disclosure.

FIG. 1 is a diagram illustrating a memory device 1100 according to an embodiment of the present disclosure.

Referring to FIG. 1, the memory device 1100 may include a memory cell array 110 that stores data and peripheral circuits 120 to 170 that perform a program, read, or erase operation.

The memory cell array 110 may include a plurality of memory blocks that store data. Each of the memory blocks may include memory cells. The memory cells may be stacked in a vertical direction over a substrate to define a three-dimensional structure.

The peripheral circuits 120 to 170 may include a row decoder 120, a voltage generator 130, a page buffer group 140, a column decoder 150, an input/output circuit 160, and a control logic circuit 170.

The row decoder 120 may select one memory block, among the memory blocks that are included in the memory cell array 110, in response to a row address RADD, and may transfer operating voltages Vop to the selected memory block.

The voltage generator 130 may generate and output the operating voltages Vop for various operations in response to an operation code OPCD. For example, the voltage generator 130 may generate a program voltage, a read voltage, an erase voltage, a pass voltage, a turn-on voltage, and a ground voltage, and may selectively output the generated voltages in response to the operation code OPCD.

The page buffer group 140 may be coupled to the memory cell array 110 through bit lines. For example, the page buffer group 140 may include page buffers that are coupled to the bit lines, respectively. The page buffers may operate at the same time in response to page buffer control signals PBSIG and may temporarily store data during a program, read, or verify operation. The page buffers may sense currents in the bit lines that vary depending on threshold voltages of the memory cells.

The column decoder 150 may transfer data DATA between the input/output circuit 160 and the page buffer group 140 in response to a column address CADD.

The input/output circuit 160 may be coupled to an external device through input/output lines IO. For example, the external device may be a controller that transmits a command CMD, an address ADD, or the data DATA to the memory device 1100. The input/output circuit 160 may input and output the command CMD, the addresses ADD, and the data DATA through the input/output lines IO. For example, the input/output circuit 160 may transfer the command CMD and the address ADD, which are received from the external device through the input/output lines IO, to the control logic circuit 170, and may transfer the data DATA, which is received from the external device through the input/output lines IO, to the column decoder 150. The input/output circuit 160 may output the data DATA that is received from the column decoder 150 to the external device.

The control logic circuit 170 may output the operation code OPCD, the row address RADD, the page buffer control signals PBSIG, and the column address CADD in response to the command CMD and the address ADD. For example, the control logic circuit 170 may include software for performing an algorithm in response to the command CMD and hardware configured to output the address ADD and various control signals.

Figure 2:
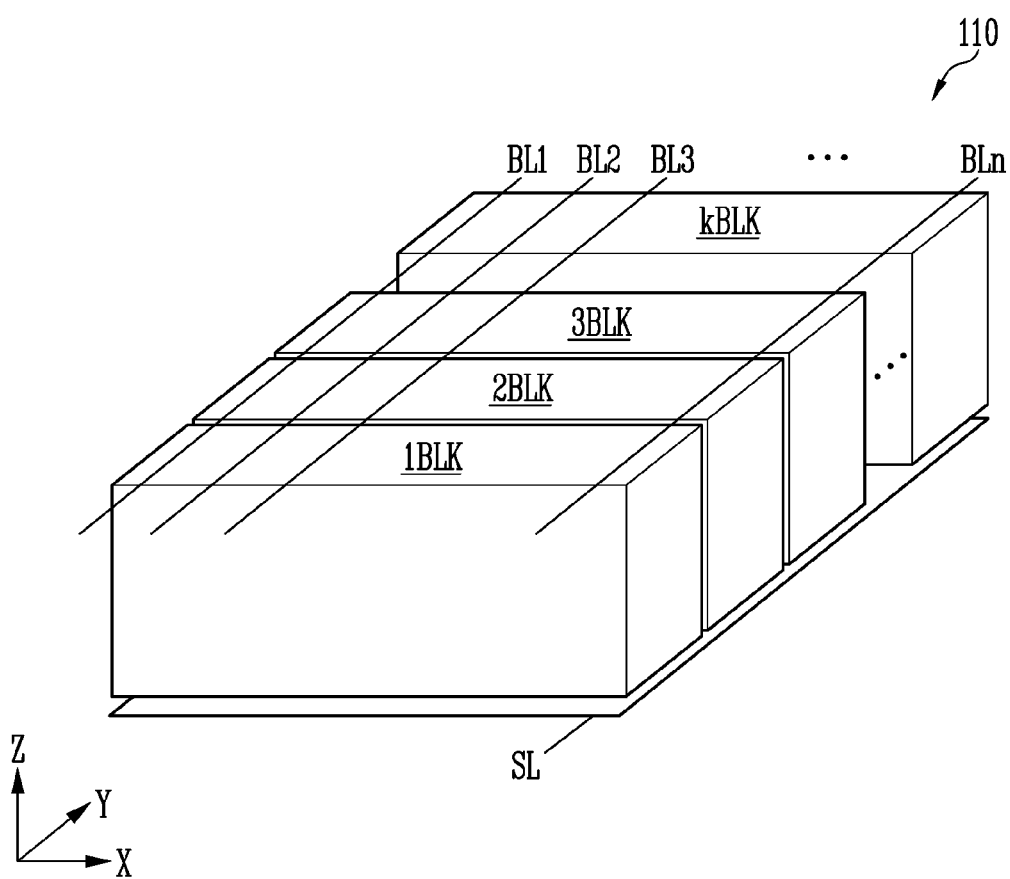
FIG. 2 is a diagram illustrating a memory cell array.

FIG. 2 is a diagram illustrating the memory cell array 110.

Referring to FIG. 2, the memory cell array 110 may include first to kth memory blocks 1BLK to kBLK, where k is a positive integer. Each of the first to kth memory blocks 1BLK to kBLK may include a plurality of memory cells that are stacked in a vertical direction from the substrate. The first to kth memory blocks 1BLK to kBLK may be arranged between a source line SL and first to nth bit lines BL1 to BLn. For example, when the first to nth bit lines BL1 to BLn are spaced apart from each other in a first direction (X direction) and extend in a second direction (Y direction) that is vertical to the first direction (X direction), the first to kth memory blocks 1BLK to kBLK may be spaced apart from each other in the second direction (Y direction). Therefore, the memory cells that are included in the first to kth memory blocks 1BLK to kBLK may be stacked in a third direction (Z direction) that is vertical to the first and second directions (X and Y directions).

Figure 3:
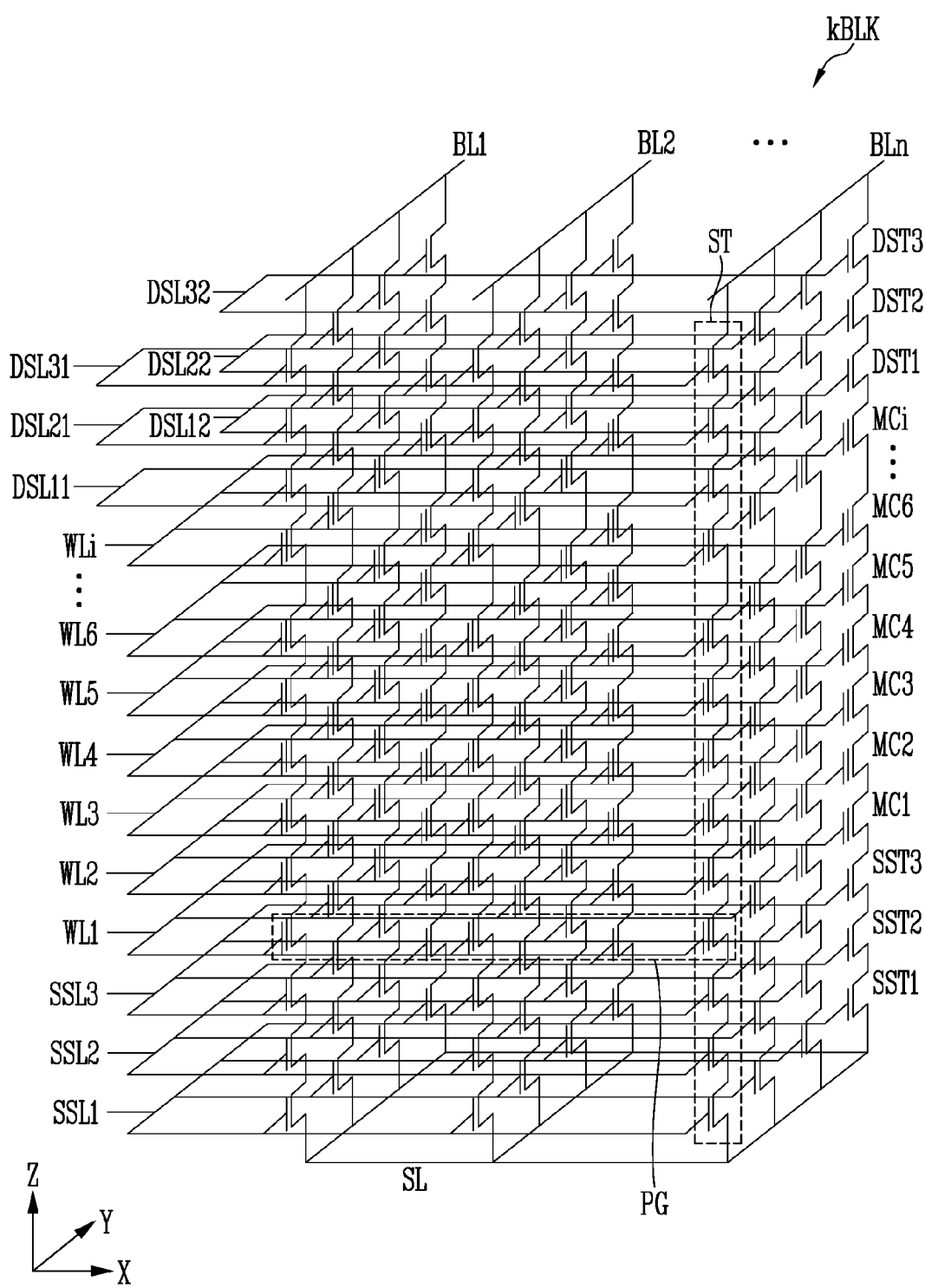
FIG. 3 is a circuit diagram illustrating a memory block according to a first embodiment of the present disclosure.

FIG. 3 is a diagram illustrating a memory block according to a first embodiment of the present disclosure.

Referring to FIG. 3, since the first to kth memory blocks 1BLK to kBLK, as shown in FIG. 2, have the same configuration, the kth memory block kBLK may be shown as an example.

The kth memory block kBLK may include strings ST that are coupled between the first to nth bit lines BL1 to BLn and the source line SL. The first to nth bit lines BL1 to BLn may extend in the second direction (Y direction) and be spaced apart from each other in the first direction (X direction). The strings ST may be spaced apart from each other in the first and second directions (X and Y directions). For example, the strings ST may be coupled between the first bit line BL1 and the source line SL and arranged between the second bit line BL2 and the source line SL. In this manner, the strings ST may be arranged between the nth bit line BLn and the source line SL. The strings ST may extend in the third direction (Z direction).

For example, one of the strings ST that is coupled to the nth bit line BLn may include first to third source select transistors SST1 to SST3, first to ith memory cells MC1 to MCi, and first to third drain select transistors DST1 to DST3. FIG. 3 shows the kth memory block kBLK for illustrating the structure of a memory block. However, the number of source select transistors, the number of memory cells, and the number of drain select transistors that are included in the strings ST may vary depending on respective memory devices.

Gates of the first to third source select transistors SST1 to SST3 that are included in different strings may be coupled to first to third source select lines SSL1 to SSL3. Gates of the first to ith memory cells MC1 to MCi may be coupled to first to ith word lines WL1 to WLi. Gates of the first to third drain select transistors DST1 to DST3 may be coupled to 11th, 12th, 21st, 22nd, 31st, and 32nd drain select lines DSL11, DSL12, DSL21, DSL22, DSL31, and DSL32.

For example, the first source select line SSL1 may be commonly coupled to the first source select transistors SST1 that are arranged at the same distance from the substrate. In other words, the first source select transistors SST1 that are formed on the same layer may be commonly coupled to the first source select line SSL1. In this manner, the second source select transistors SST2, which are formed on a different layer from that of the first source select transistors SST1, may be commonly coupled to the second source select line SSL2. The third source select transistors SST3, which are formed on a different layer from that of the second source select transistors SST2, may be commonly coupled to the third source select line SSL3. The first to third source select lines SSL1 to SSL3 may be formed on different layers.

In the manner as described above, the ith memory cells MCi that are formed on the same layer may be commonly coupled to the ith word line WLi, and the first to ith word lines WL1 to WLi may be formed on different layers. A group of memory cells that are included in different strings ST and coupled to the same word line may constitute a page PG.

The first to third drain select transistors DST1 to DST3 that are included in different strings ST may be coupled to drain select lines that are separated from each other. More specifically, the first to third drain select transistors DST1 to DST3 that are arranged in the first direction (X direction) may be coupled to the same drain select line, and the first to third drain select transistors DST1 to DST3 that are arranged in the second direction (Y direction) may be coupled to drain select lines that are separated from each other. For example, some of the first drain select transistors DST1 may be coupled to the 11th drain select line DSL11, and the other first drain select transistors DST1 may be coupled to the 12th drain select line DSL12. The 12th drain select line DSL12 may be separated from the 11th drain select line DSL11. Therefore, a voltage that is applied to the 11th drain select line DSL11 may be different from a voltage that is applied to the 12th drain select line DSL12. In this manner, some of the second drain select transistors DST2 may be coupled to the 21st drain select line DSL21, and the other second drain select transistors DST2 may be coupled to the 22nd drain select line DSL22. Some of the third drain select transistors DST3 may be coupled to the 31st drain select line DSL31, and the other third drain select transistors DST3 may be coupled to the 32nd drain select line DSL32.

Though not shown in FIG. 3, dummy lines may be arranged between a drain select line and a word line and between a source select line and the word line.

Figure 4:
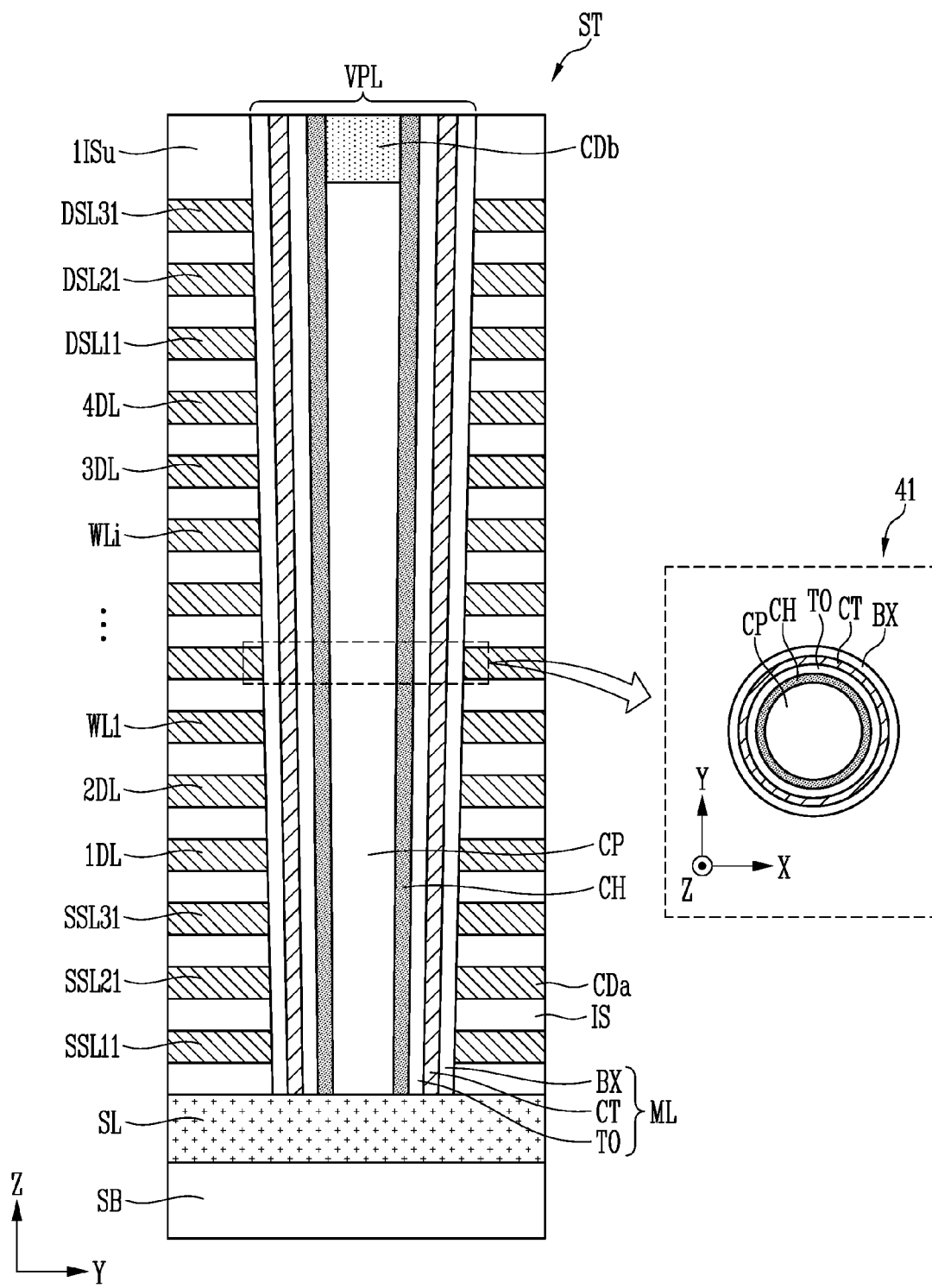
FIG. 4 is a cross-sectional view of a string according to a first embodiment of the present disclosure.

FIG. 4 is a cross-sectional view of a string according to a first embodiment of the present disclosure.

Referring to FIG. 4, one of the strings ST as shown in FIG. 3 may be shown.

The source line SL, insulating layers IS, and first conductive layers CDa may be formed on a substrate SB. As shown in FIG. 4, the source line SL may be formed on the substrate SB. However, a peripheral circuit may be formed between the substrate SB and the source line SL. The source line SL may include a conductive material.

The insulating layers IS and the first conductive layers CDa may be stacked alternately with each other. Each of the insulating layers IS may include an oxide layer or a silicon oxide layer. The first conductive layers CDa may include a metal material such as tungsten (W), molybdenum (Mo), cobalt (Co), and nickel (Ni), or a semiconductor material, such as silicon (Si) or polysilicon (Poly-Si). However, the present disclosure is not limited thereto. Some of the first conductive layers CDa may serve as the 11th to 31st source select lines SSL11 to SSL31, the first to ith word lines WL1 to WLi, or the 11th to 31st drain select lines DSL11 to DSL31. In addition, some of the first conductive layers CDa may serve as first to fourth dummy lines 1DL to 4DL. The first to fourth dummy lines 1DL to 4DL may be coupled to gates of dummy cells that are included in a vertical plug VPL. The dummy cells may refer to cells that are not substantially used in a memory block. For example, the dummy cells may store dummy data. The first to fourth dummy lines 1DL to 4DL and the dummy cells may be provided to prevent damage to normal lines during the manufacturing processes of the memory block.

In the memory block including the dummy cells, the 11th to 31st source select lines SSL11 to SSL31, the first and second dummy lines 1DL and 2DL, the first to ith word lines WL1 to WLi, the third and fourth dummy lines 3DL and 4DL, and the 11th to 31st drain select lines DSL11 to DSL31 may be sequentially spaced apart from each other and stacked on top of each other. The insulating layers IS may be formed between the 11th to 31st source select lines SSL11 to SSL31, the first and second dummy lines 1DL and 2DL, the first to ith word lines WL1 to WLi, the third and fourth dummy lines 3DL and 4DL, and the 11th to 31st drain select lines DSL11 to DSL31.

The source select transistors, the dummy cells, the memory cells, and the drain select transistors may be formed in the vertical plug VPL. The vertical plug VPL may vertically pass through the insulating layers IS and the first conductive layers CDa. The vertical plug VPL may have a cylindrical shape. For example, a memory layer ML may be formed at an outermost edge of the vertical plug VPL, and a channel layer CH, and a core pillar CP may be sequentially formed inside the memory layer ML. The core pillar CP may have a cylindrical shape. The channel layer CH may have a cylindrical shape that surrounds a side surface of the core pillar CP. The memory layer ML may have a cylindrical shape that surrounds a side surface of the channel layer CH. The core pillar CP may include an insulating material, such as an oxide layer (e.g. a silicon oxide layer). The channel layer CH may include a silicon layer or a polysilicon layer. According to a memory device, the core pillar CP might not be formed. In the structure in which the core pillar CP is not formed, the channel layer CH may be shaped like a pillar.

The memory layer ML may include a tunnel isolation layer TO, a charge trap layer CT, and a blocking layer BX. The tunnel isolation layer TO may include an oxide layer or a silicon oxide layer and have a cylindrical shape that surrounds the side surface of the channel layer CH. The charge trap layer CT may include a nitride layer and have a cylindrical shape that surrounds a side surface of the tunnel isolation layer TO. The blocking layer BX may include an oxide layer or a silicon oxide layer and have a cylindrical shape that surrounds a side surface of the charge trap layer CT. A drawing that corresponds to reference numerals '41' may correspond to a plan view of the structure of a memory cell in the first and second directions (X and Y directions). As shown in the plan view (41), a memory cell may include the channel layer CH, the tunnel isolation layer TO, the charge trap layer CT, and the blocking layer BX that sequentially surround the core pillar CP.

A first upper insulating layer 1ISu, which is formed at the top among the insulating layers IS, may have a greater thickness than any other insulating layer IS that is formed under the first upper insulating layer 1ISu. A second conductive layer CDb may be formed at an upper portion of the core pillar CP at a position that corresponds to the layer at which the first upper insulating layer 1ISu is formed. The second conductive layer CDb may be formed to reduce the resistance of the channel layer CH in a region in which the drain select transistors are formed. The second conductive layer CDb may include a polysilicon layer.

FIG. 4 is a cross-sectional view of the structure of the string ST according to an embodiment of the present disclosure. However, the numbers of lines (SSL11 to DSL31) might not be limited to those shown in FIG. 4.

Figure 5:
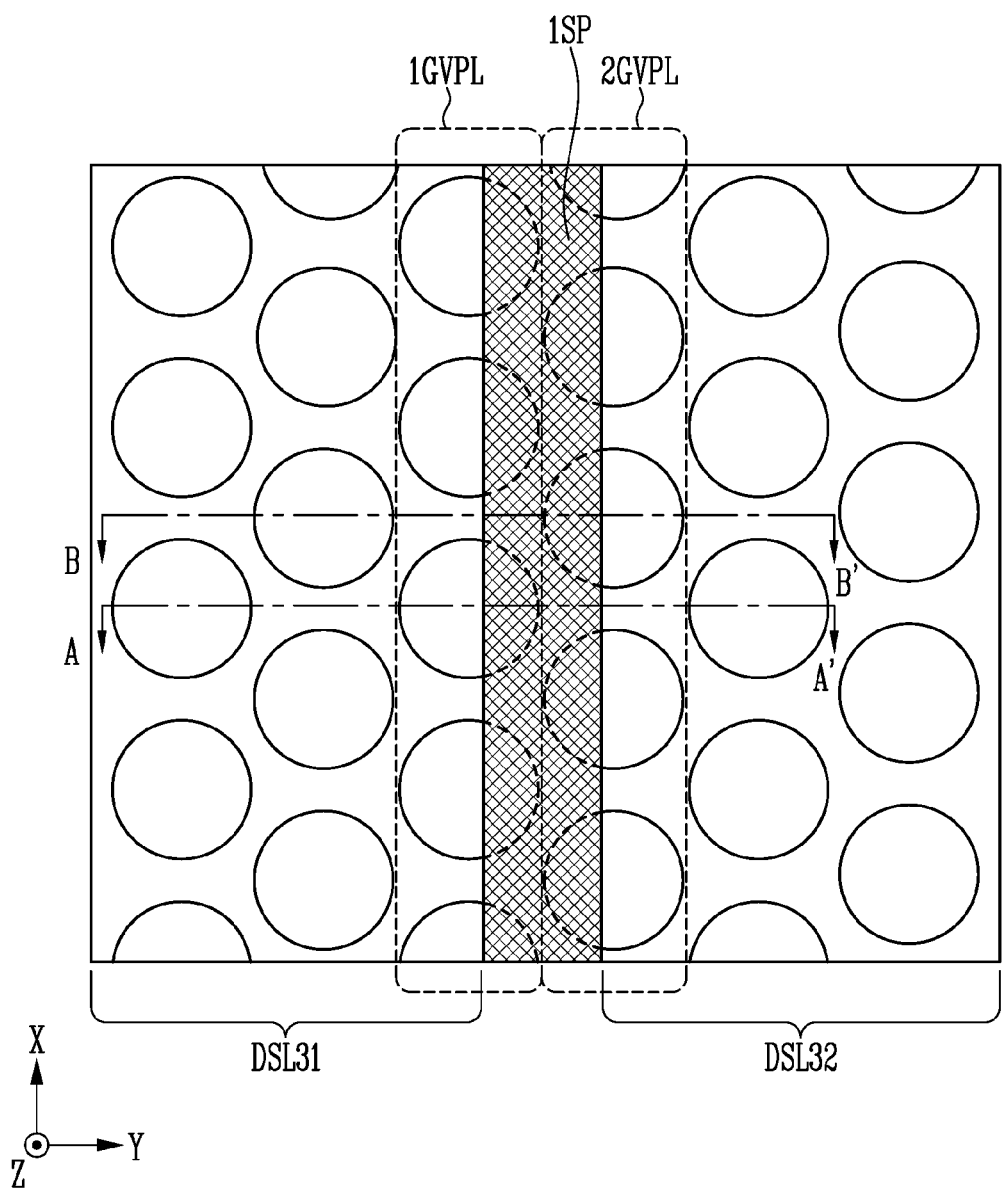
FIG. 5 is a plan view illustrating a first isolation pattern according to a first embodiment of the present disclosure.

FIG. 5 is a plan view illustrating a first isolation pattern 1SP according to a first embodiment of the present disclosure.

Referring to FIG. 5, the first isolation pattern 1SP may be provided to separate drain select lines that are formed on the same layer. For example, when it is assumed that the 31st drain select line DSL31 and the 32nd drain select line DSL32 are formed on the same layer, the 31st drain select line DSL31 and the 32nd drain select line DSL32 may include the same first conductive layer that is formed on the same layer and may be electrically insulated from each other by the first isolation pattern 1SP. Therefore, different voltages may be applied to the 31st drain select line DSL31 and the 32nd drain select line DSL32.

A plurality of vertical plugs may be coupled to the 31st drain select line DSL31 and the 32nd drain select line DSL32. The first isolation pattern 1SP may be formed to overlap with vertical plugs, among the vertical plugs that are coupled to the 31st drain select line DSL31, adjacent to the 32nd drain select line DSL32 and vertical plugs, among the vertical plugs that are coupled to the 32nd drain select line DSL32, adjacent to the 31st drain select line DSL31. For example, the vertical plugs, among the vertical plugs that are coupled to the 31st drain select line DSL31, adjacent to the 32nd drain select line DSL32, may be defined as a first vertical plug group 1GVPL, and the vertical plugs, among the vertical plugs that are coupled to the 32nd drain select line DSL32, adjacent to the 31st drain select line DSL31, may be defined as a second vertical plug group 2GVPL. The first isolation pattern 1SP may have a line shape to overlap with a portion of the first vertical plug group 1GVPL and a portion of the second vertical plug group 2GVPL. The channel layer may remain at portions of the vertical plugs that are included in the first vertical plug group 1GVPL that do not overlap with the first isolation pattern 1SP. Thus, a turn-on or turn-off operation of a transistor may be performed by the remaining channel layer.

Unlike this embodiment, when the first isolation pattern 1SP overlaps with the entirety of the vertical plugs arranged in the first direction (X direction), the channel layer may be removed from the layer on which the first isolation pattern 1SP overlaps with the entirety of the vertical plugs. As a result, a turn-on or turn-off operation of a transistor might not be performed. The unused vertical plugs may become dummy plugs.

According to this embodiment, since the first isolation pattern 1SP overlaps with only portions of the vertical plugs, not the entirety of the vertical plugs that are arranged in a predetermined region, portions of the channel layers may remain in all layers in which the drain select lines are formed. Therefore, according to an embodiment, even when the first isolation pattern 1SP is formed, all vertical plugs may serve as normal plugs.

When the vertical plugs that are included in the first vertical plug group 1GVPL and the vertical plugs that are included in the second vertical plug group 2GVPL are arranged in a zigzag pattern, different areas of the vertical plugs may overlap with the first isolation pattern 1SP. Structures of the respective areas will be descried below with reference to cross sections that are taken along A-A' and B-B'.

Figure 6A:
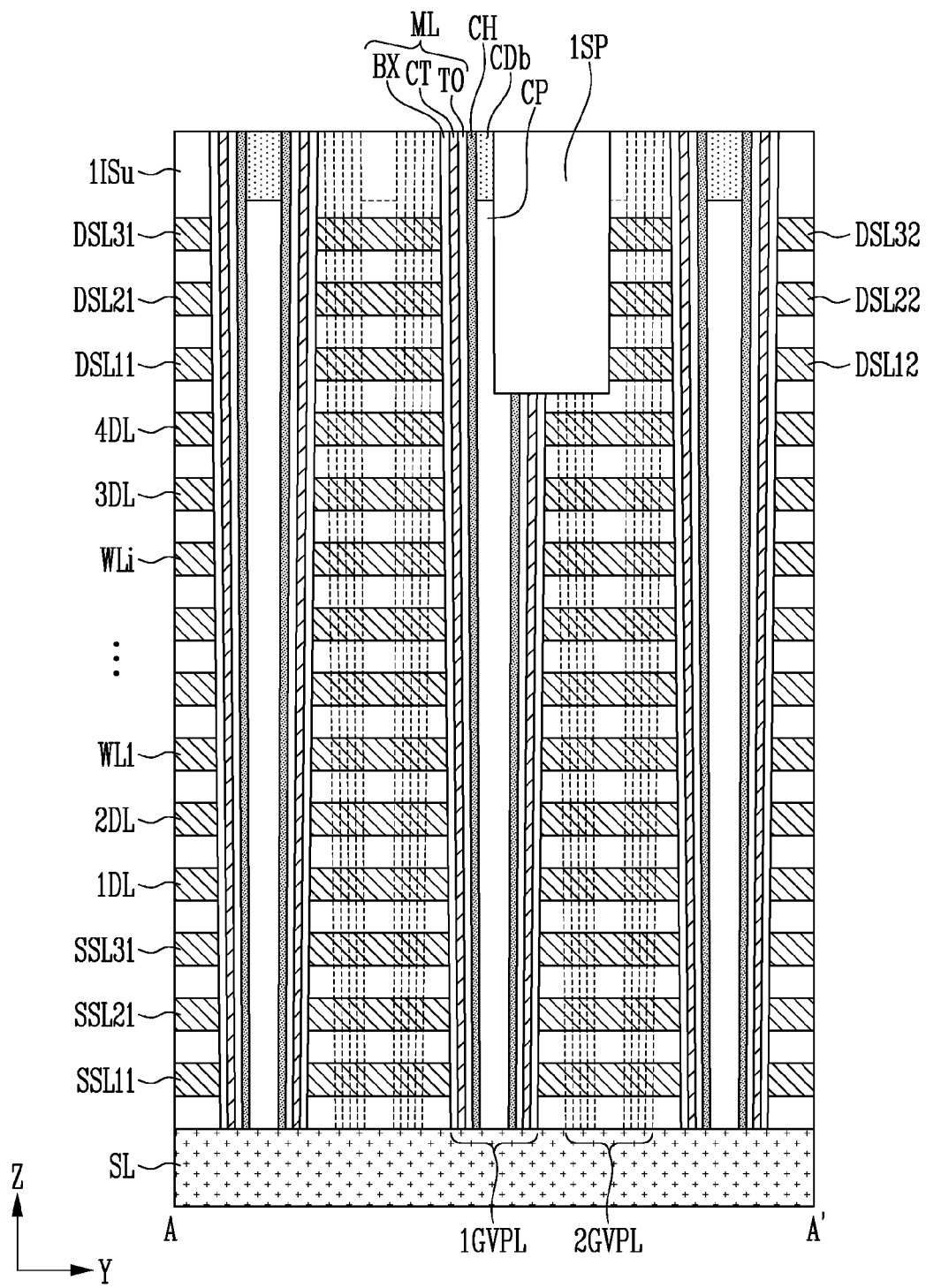
FIGS. 6A and 6B are cross-sectional views of the structure of a memory device according to a first embodiment of the present disclosure.
Figure 6B:
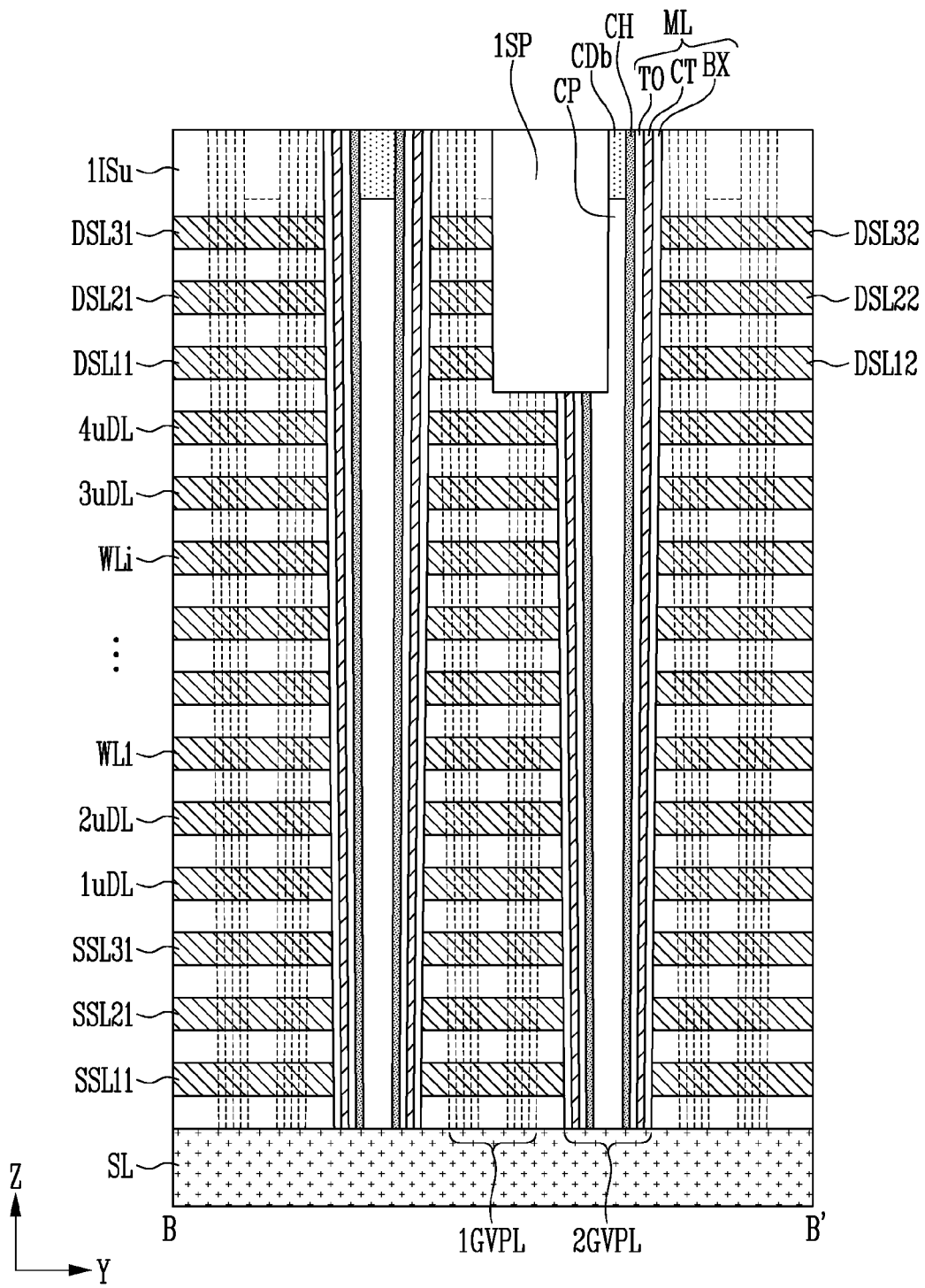

FIGS. 6A and 6B are cross-sectional views illustrating the structure of the memory device according to a first embodiment of the present disclosure. FIG. 6A is a cross-sectional view taken along A-A' of FIG. 5. FIG. 6B is a cross-sectional view taken along B-B' of FIG. 5.

Referring to FIG. 6A, in the A-A' cross-section, the first isolation pattern 1SP may overlap with a portion of a vertical plug that is included in the first vertical plug group 1GVPL. In FIG. 6A, vertical plugs that are indicated by dotted lines may refer to other vertical plugs that do not appear in the A-A' cross section. The first isolation pattern 1SP may separate the drain select lines that are coupled to the vertical plug and might not separate the word lines. For example, the 11th, 21st and 31st drain select lines DSL11, DSL21, and DSL31 may be located at the left side of the first isolation pattern 1SP, and the 12th, 22nd, and 32nd drain select lines DSL12, DSL22, and DSL32 may be located at the right side of the first isolation pattern 1SP.

The lowest end of the first isolation pattern 1SP may be located between the bottom of the lowermost drain select line, among the stacked drain select lines, and a word line. For example, the lowest end of the first isolation pattern 1SP may be deep enough to separate all drain select lines, to separate the drain select lines and the fourth dummy line 4DL, or to separate the drain select lines and the third and fourth dummy lines 3DL and 4DL. However, the first isolation pattern 1SP might not contact the uppermost word line.

The first isolation pattern 1SP may be formed at the right side from the center of the vertical plug that is included in the first vertical plug group 1GVPL. Therefore, the channel layer CH may remain at the top left portion of the first vertical plug group 1GVPL as opposed to the top right portion of the first vertical plug group 1GVPL in which the first isolation pattern 1SP is formed. A portion of the vertical plug that does not overlap with the first isolation pattern 1SP may be surrounded by the 11th, 21st, and 31st drain select lines DSL11, DSL21, and DSL31. Thus, a channel may or might not be formed in the channel layer CH, depending on the voltage that is applied to the 11th, 21st, and 31st drain select lines DSL11, DSL21, and DSL31. As a result, drain select transistors, among the drain select transistors coupled to the 11th, 21st, and 31st drain select lines DSL11, DSL21, and DSL31, which overlap with the first isolation pattern 1SP, may perform a normal switching operation. For example, when a voltage of 0 V or a turn-off voltage that is a negative voltage is applied to the 11th, 21st, and 31st drain select lines DSL11, DSL21, and DSL31, a current path may be blocked from the channel layer CH that remains at the left side of the first isolation pattern 1SP. Thus, the drain select transistors may be turned off. When a turn-on voltage that is a positive voltage greater than 0 V is applied to the 11th, 21st, and 31st drain select lines DSL11, DSL21, and DSL31, a current path may be formed on the channel layer CH that remains at the left side of the first isolation pattern 1SP. Thus, the drain select transistors may be turned on.

Referring to FIG. 6B, in the B-B' cross-section, the first isolation pattern 1SP may overlap with portions of the vertical plugs that are included in the second vertical plug group 2GVPL. In FIG. 6B, vertical plugs that are indicated by dotted lines may refer to other vertical plugs that do not appear in the B-B' cross section. The first isolation pattern 1SP may separate the drain select lines that are coupled to the vertical plug and might not separate the word lines. For example, the 11th, 21st and 31st drain select lines DSL11, DSL21, and DSL31 may be located at the left side of the first isolation pattern 1SP, and the 12th, 22nd, and 32nd drain select lines DSL12, DSL22, and DSL32 may be located at the right side of the first isolation pattern 1SP.

The lowest end of the first isolation pattern 1SP may be located between the bottom of the lowermost drain select line, among the stacked drain select lines, and a word line. For example, the lowest end of the first isolation pattern 1SP may be deep enough to separate all drain select lines, to separate the drain select lines and the fourth dummy line 4DL, or to separate the drain select lines and the third and fourth dummy lines 3DL and 4DL. However, the first isolation pattern 1SP might not contact the uppermost word line.

The first isolation pattern 1SP may be the same pattern as the first isolation pattern 1SP as shown in FIG. 6A and may be formed at the left side from the center of the vertical plug included in the second vertical plug group 2GVPL. Therefore, the channel layer CH may remain at the top right portion of the second vertical plug group 2GVPL as opposed to the top left portion of the second vertical plug group 2GVPL in which the first isolation pattern 1SP is formed. A portion of the vertical plug that does not overlap with the first isolation pattern 1SP may be surrounded by the 12th, 22nd, and 32nd drain select lines DSL12, DSL22, and DSL32. Thus, a channel may or might not be formed in the channel layer CH, depending on the voltage that is applied to the 12th, 22nd, and 32nd drain select lines DSL12, DSL22, and DSL32. Therefore, drain select transistors, among the drain select transistors coupled to the 12th, 22nd, and 32nd drain select lines DSL12, DSL22, and DSL32, which overlap with the first isolation pattern 1SP, may perform a normal switching operation. For example, when a voltage of 0 V or a turn-off voltage that is a negative voltage less than 0 V is applied to the 12th, 22nd, and 32nd drain select lines DSL12, DSL22, and DSL32, a current path may be blocked from the channel layer CH that remains at the right side of the first isolation pattern 1SP. Thus, the drain select transistors may be turned off. When a turn-on voltage that is a positive voltage greater than 0 V is applied to the 12th, 22nd, and 32nd drain select lines DSL12, DSL22, and DSL32, a current path may be formed on the channel layer CH that remains at the right side of the first isolation pattern 1SP. Thus, the drain select transistors may be turned on.

Figure 7:
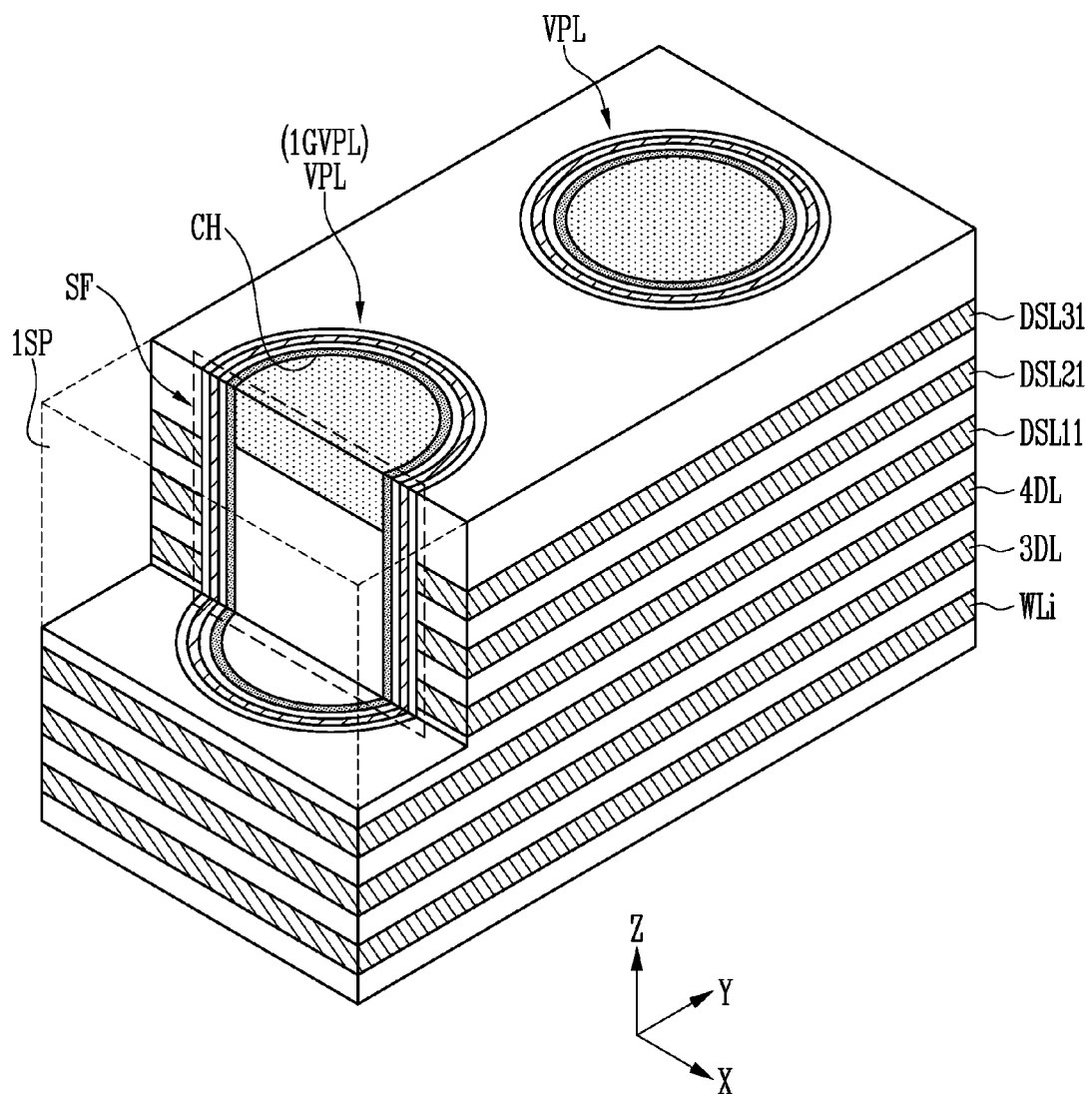
FIG. 7 is a perspective view illustrating the structure of a vertical plug overlapping with a first isolation pattern.

FIG. 7 is a perspective view illustrating the structure of the vertical plug overlapping with the first isolation pattern 1SP.

Referring to FIG. 7, even when the first isolation pattern 1SP overlaps with a portion of the vertical plug VPL that is included in the first vertical plug group 1GVPL, if the channel layer CH remains in a portion of the vertical plug VPL that does not overlap with the first isolation pattern 1SP, a transistor may operate by using the remaining channel layer CH. In addition, impurities may be further injected into a surface SF of the portion of the vertical plug VPL that is cut for the first isolation pattern 1SP so as to prevent the generation of a leakage current that may occur at the surface SF of the cut portion.

A method of manufacturing a memory device according to the above-described first embodiment is described below.

FIGS. 8A to 8E are diagrams illustrating a method of manufacturing a memory device according to a first embodiment of the present disclosure.

Figure 8A:
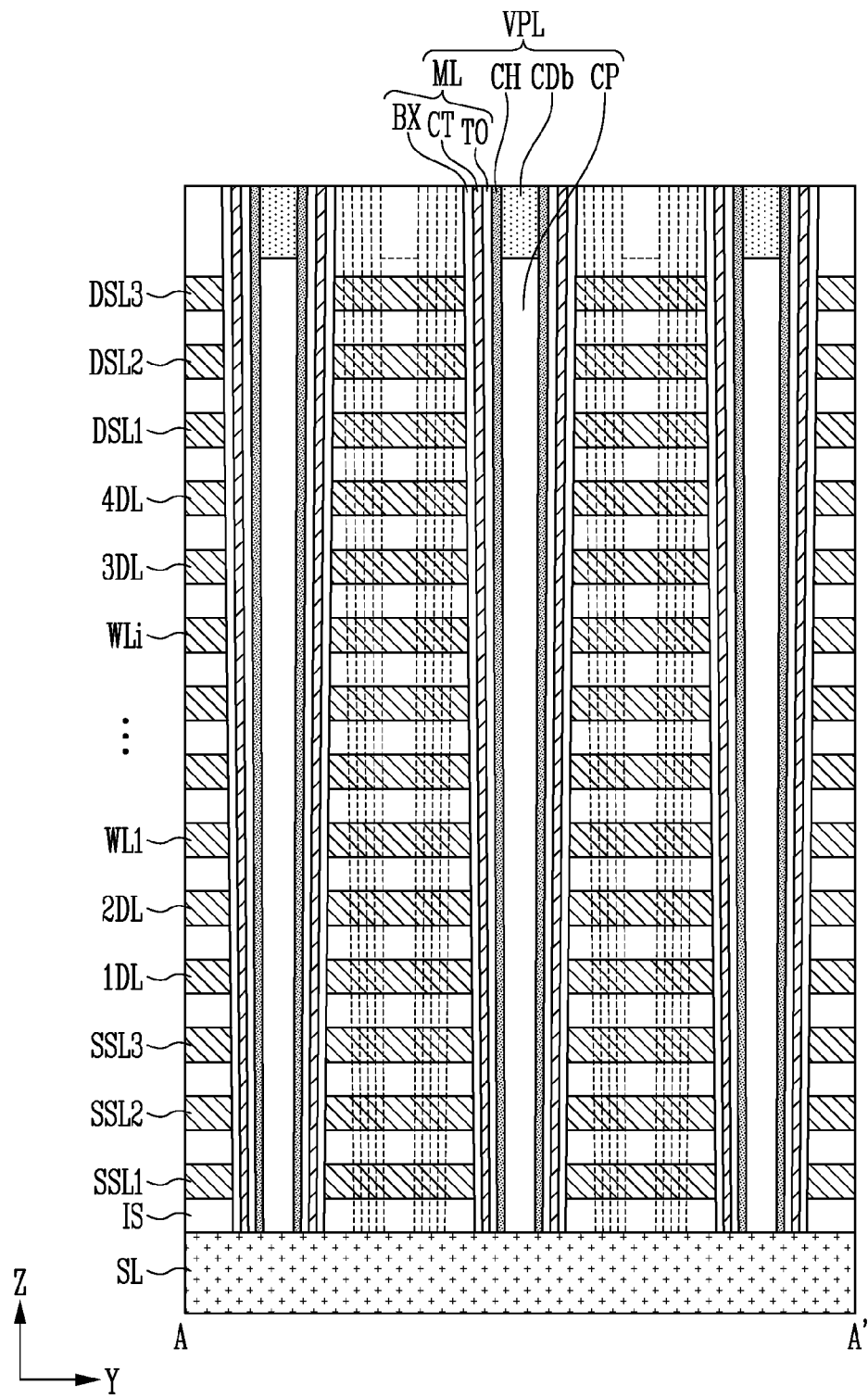
FIGS. 8A to 8E are diagrams illustrating a method of manufacturing a memory device according to a first embodiment of the present disclosure.

Referring to FIG. 8A, the first to third source select lines SSL1 to SSL3, the first and second dummy lines 1DL and 2DL, the first to ith word lines WL1 to WLi, the third and fourth dummy lines 3DL and 4DL, and first to third drain select lines DSL1 to DSL3 may be spaced apart from each other and stacked on the source line SL, and the vertical plugs VPL may vertically pass through the first to third source select lines SSL1 to SSL3, the first and second dummy lines 1DL and 2DL, the first to ith word lines WL1 to WLi, the third and fourth dummy lines 3DL and 4DL, and the first to third drain select lines DSL1 to DSL3. The insulating layers IS may be formed between the first to third source select lines SSL1 to SSL3, the first and second dummy lines 1DL and 2DL, the first to ith word lines WL1 to WLi, the third and fourth dummy lines 3DL and 4DL, and the first to third drain select lines DSL1 to DSL3. The first to third source select lines SSL1 to SSL3, the first to ith word lines WL1 to WLi, and the first to third drain select lines DSL1 to DSL3 may include, but not limited to, a metal material, such as tungsten (W), molybdenum (Mo), cobalt (Co), and nickel (Ni), or a semiconductor material, such as silicon (Si) or polysilicon (Poly-Si). Each of the insulating layers IS may include an oxide layer or a silicon oxide layer.

The vertical plugs VPL may be formed in a vertical hole that vertically passes through the first to third source select lines SSL1 to SSL3, the first and second dummy lines 1DL and 2DL, the first to ith word lines WL1 to WLi, the third and fourth dummy lines 3DL and 4DL, and the first to third drain select lines DSL1 to DSL3. Each of the vertical plugs VPL may include the core pillar CP having a columnar shape, and the channel layer CH, the tunnel isolation layer TO, the charge trap layer CT, and the blocking layer BX that sequentially surround a side surface of the core pillar CP. The tunnel isolation layer TO, the charge trap layer CT, and the blocking layer BX may form the memory layer ML. The second conductive layer CDb may be formed on top of the core pillar CP. The core pillar CP may include an insulating material, such as an oxide layer or a silicon oxide layer. The channel layer CH may include a silicon layer or a polysilicon layer. According to a memory device, the core pillar CP might not be formed. In the structure in which the core pillar CP is not formed, the channel layer CH may be shaped like a pillar. The memory layer ML may include the tunnel isolation layer TO, the charge trap layer CT, and the blocking layer BX. The tunnel isolation layer TO may include an oxide layer or a silicon oxide layer. The charge trap layer CT may include a nitride layer. The blocking layer BX may include an oxide layer or a silicon oxide layer. As shown in FIG. 5, the vertical plugs VPL may be arranged in a zigzag pattern in the plane that is defined in the first and second directions (X and Y directions).

Figure 8B:
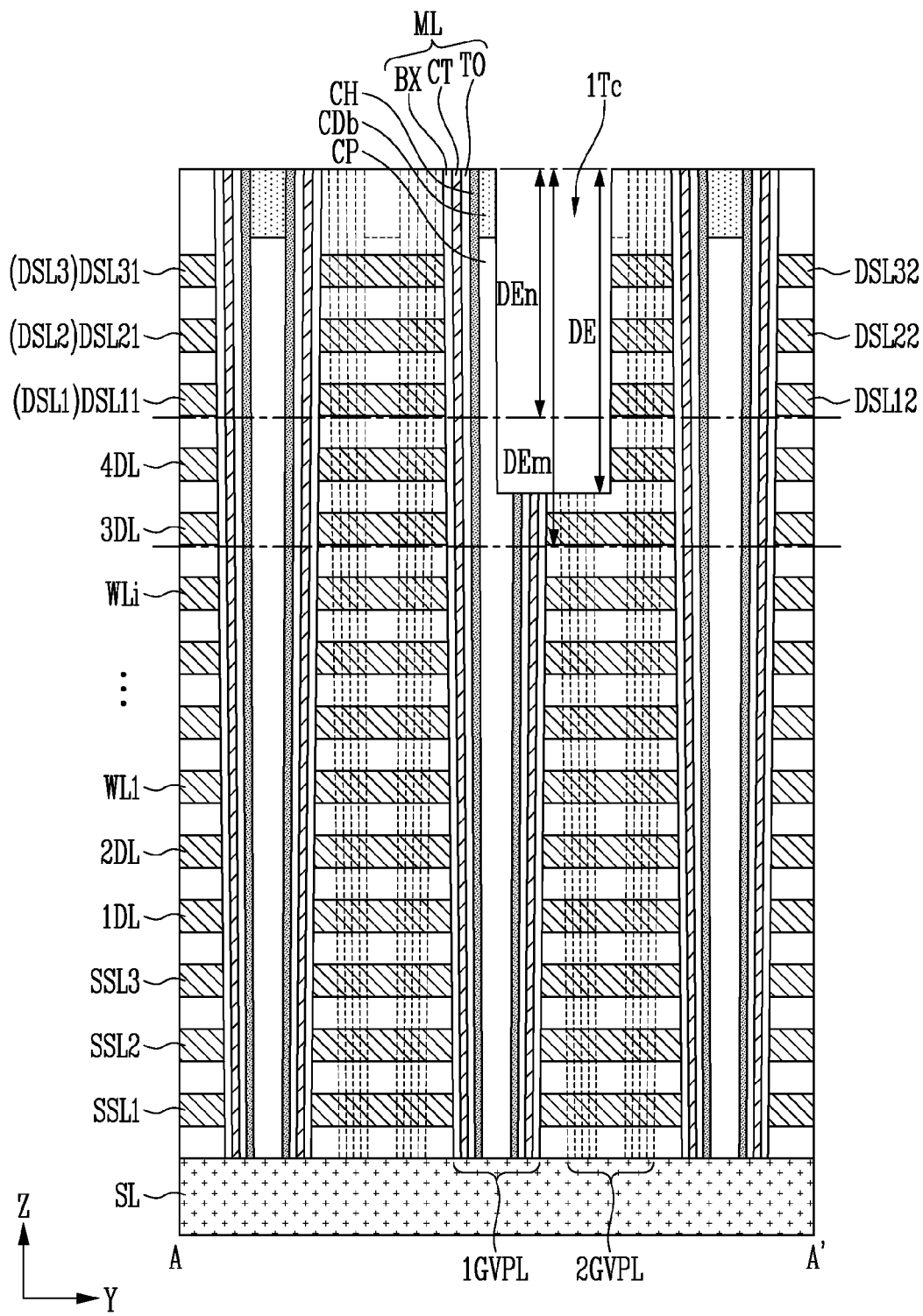

Referring to FIG. 8B, a first trench 1Tc may overlap with portions of vertical plugs that are included in the first vertical plug group 1GVPL and the second vertical plug group 2GVPL, among the vertical plugs, which are adjacent to each other. For example, the first trench 1Tc may overlap with a portion of a vertical plug that is included in the first vertical plug group 1GVPL and a portion of a vertical plug that is included in the second vertical plug group 2GVPL. The first trench 1Tc may be formed by sequentially etching the upper structures of the vertical plugs. The etch process for forming the first trench 1Tc may be performed until the third to first drain select lines DSL3 to DSL1 are separated in the second direction (Y direction), and a portion of the channel layer CH that is included in the vertical plug may remain from top. The first trench 1Tc may be formed to separate the dummy lines up to the fourth dummy line 4DL or the third dummy line 3DL so that the third to first drain select lines DSL3 to DSL1 may be completely separated in the second direction (Y direction) by the first trench 1Tc. When a dummy line is formed between a drain select line and a word line, the dummy line may prevent exposure of the word line during the etch process for forming the first trench 1Tc.

When a depth from a top portion of the vertical plugs to a bottom portion of the drain select lines is defined as a minimum depth DEn and a depth from the top portion of the vertical plugs to a bottom portion of the dummy lines is defined as a maximum depth DEm, a depth DE of the first trench 1Tc may be greater than the minimum depth DEn and less than the maximum depth DEm. FIG. 8B illustrates an embodiment of the first trench 1Tc that separates the first to third drain select lines DSL1 to DSL3 and the fourth dummy line 4DL.

The first trench 1Tc may be formed by partially etching the vertical plug. The second conductive layer CDb, the core pillar CP, the channel layer CH, the tunnel isolation layer TO, the charge trap layer CT, and the blocking layer BX may be partially exposed through the side surface of the first trench 1Tc.

The first trench 1Tc may separate the third drain select line DSL3 into the 31st and 32nd drain select lines DSL31 and DSL32, may separate the second drain select line DSL2 into the 21st and 22nd drain select lines DSL21 and DSL22, and may separate the first drain select line DSL1 into the 11th and 12th drain select lines DSL11 and DSL12. The fourth dummy line 4DL may be separated into dummy lines that are arranged at the left and right sides of the first trench 1Tc. The 31st, 21st, and 11th drain select lines DSL31, DSL21, and DSL11 may be coupled to the vertical plugs that are included in the first vertical plug group 1GVPL. The 32nd, 22nd, and 12th drain select lines DSL32, DSL22, and DSL12 may be coupled to the vertical plugs that are included in the second vertical plug group 2GVPL.

Figure 8C:
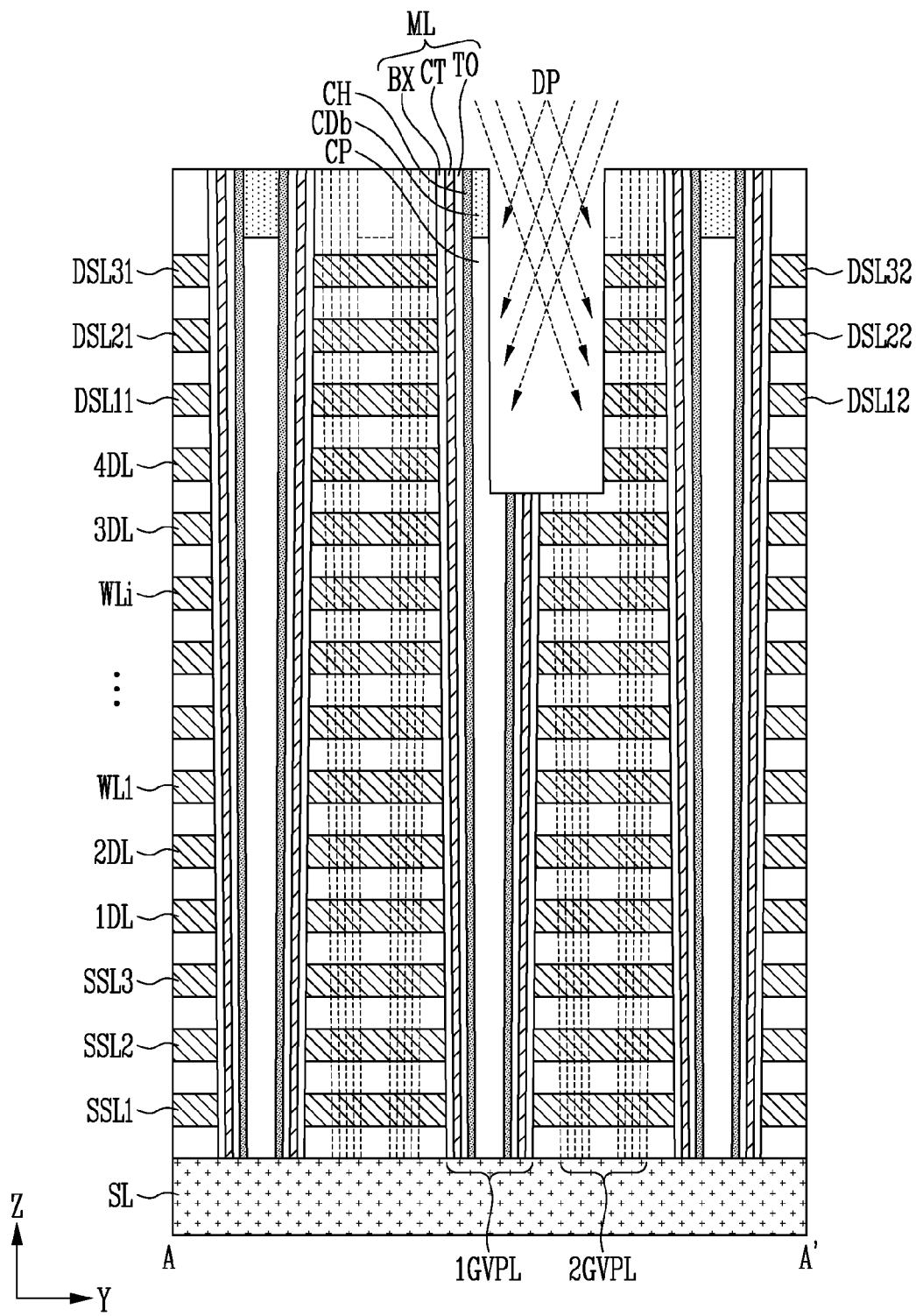

Referring to FIG. 8C, an impurity (DP) injection process may be performed on an inner surface of the first trench 1Tc. The impurity (DP) injection process may be performed to reduce a leakage current that is caused by drain select transistors that are included in the vertical plugs in which the first trench 1Tc is formed. For example, the impurity DP may be phosphorous, boron, argon, or arsenic ions. However, other than these ions, various ions may be used for preventing a leakage current. As shown in FIG. 7, the channel layer CH may be exposed through the surface SF of the first trench 1Tc in which the first isolation pattern 1SP is formed. Thus, the impurity (DP) injection process may be performed through a tilting method. In the impurity (DP) injection process through the tilting method, an angle of incidence at which the impurity DP is injected might not be limited to 90 degrees with respect to the substrate. For example, the impurity DP may be injected into a target layer at the angle of incidence that is less than or greater than 90 degrees. Therefore, the impurity DP may be uniformly injected into the channel layer CH that is exposed through the side and bottom surfaces of the first trench 1Tc.

Figure 8D:
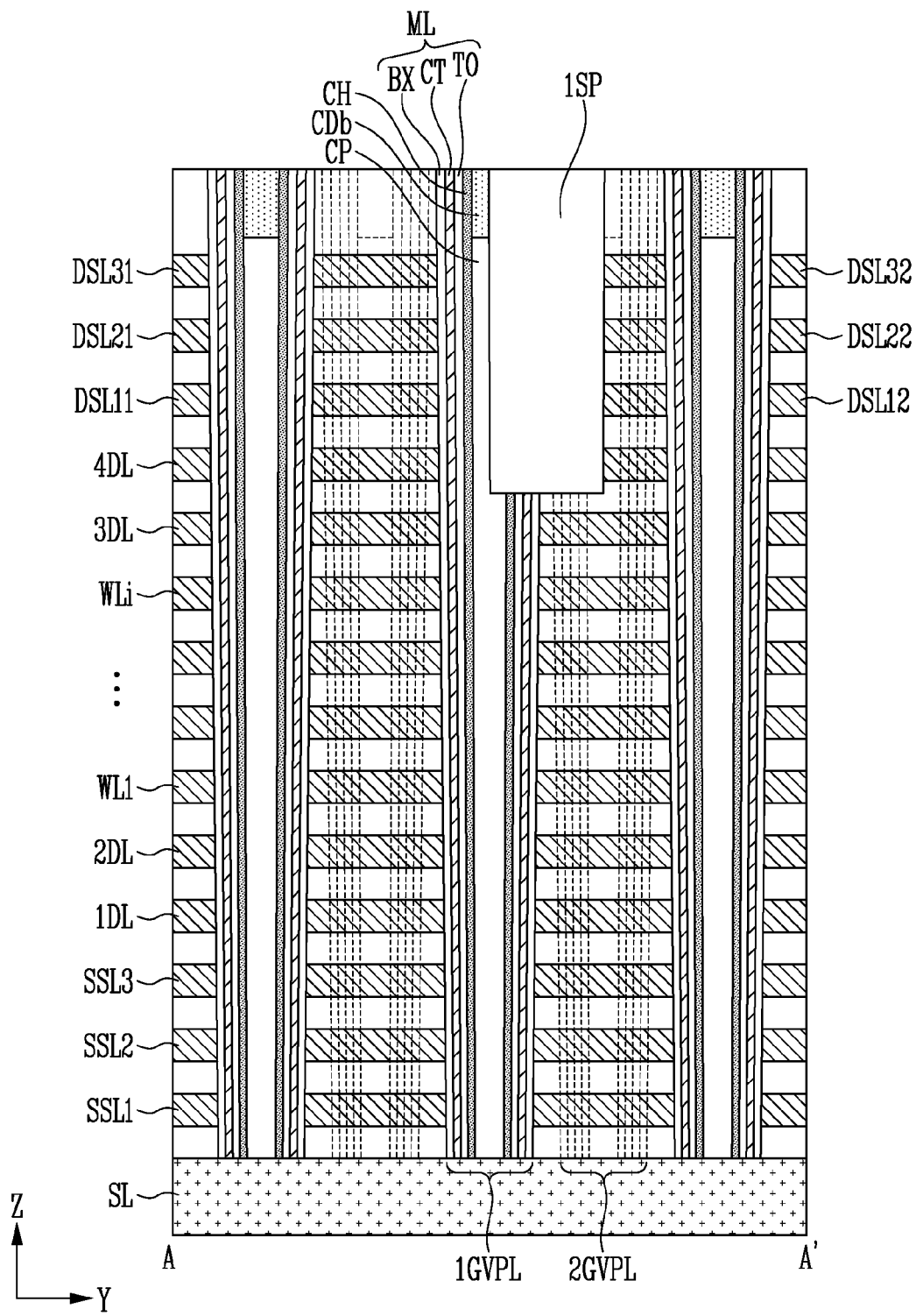

Referring to FIG. 8D, the first isolation pattern 1SP may be formed in the first trench 1Tc having the surface into which the impurity DP is injected. The first isolation pattern 1SP may include an insulating material, such as an oxide layer or a silicon oxide layer. For example, after an insulating material is coated over the entire structure including the first trench 1Tc, a planarizing process may be performed thereon until a top surface of the vertical plug VPL is exposed, so that the first isolation pattern 1SP that remains in the first trench 1Tc may be formed.

Figure 8E:
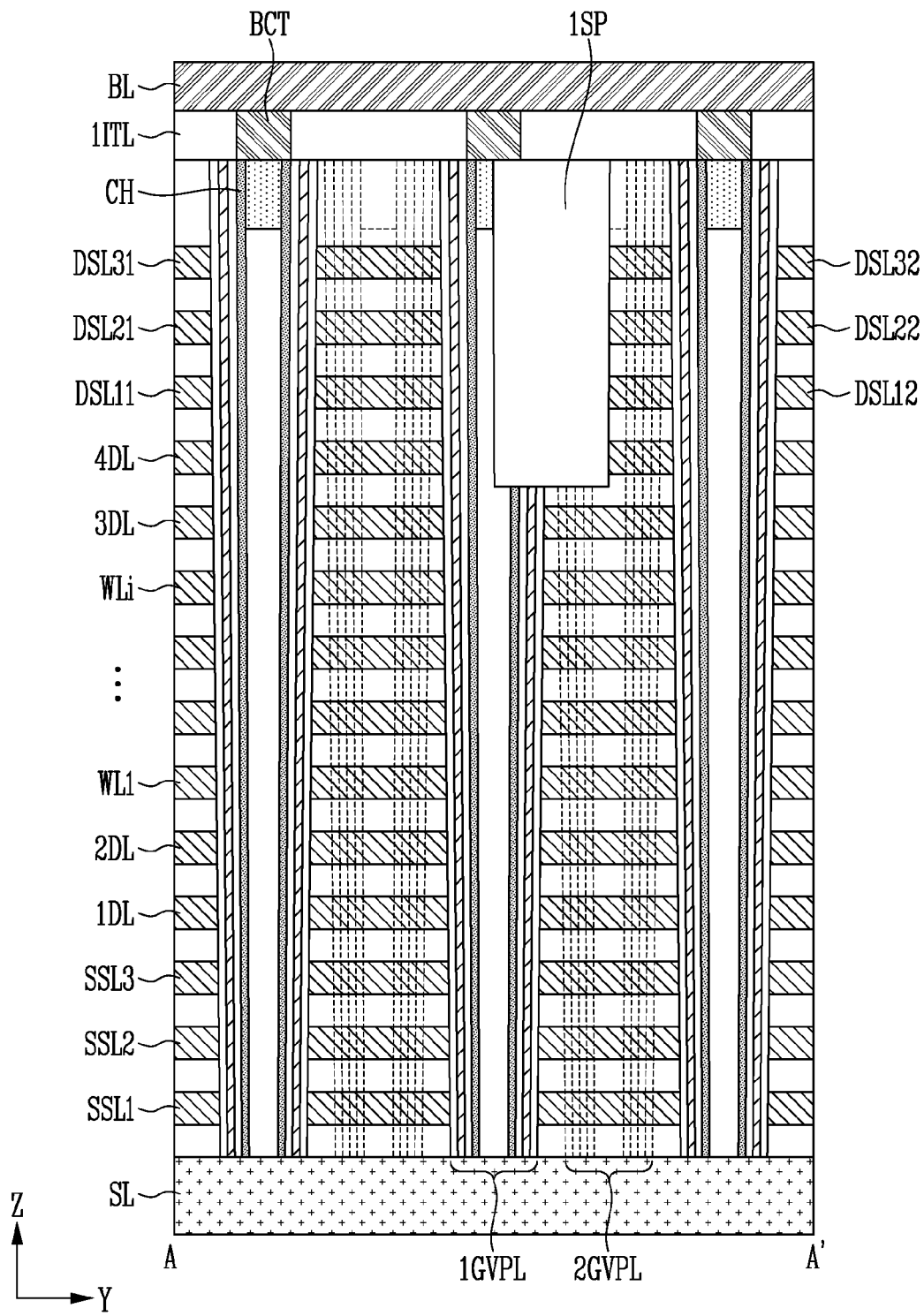

Referring to FIG. 8E, an interlayer insulating layer 1ITL may be formed over the entire structure including the first isolation pattern 1SP. The interlayer insulating layer 1ITL may include an oxide layer or a silicon oxide layer. Subsequently, contact holes may be formed to expose the channel layers CH that are included in the vertical plugs, and bit line contacts BCT that include a conductive material may be formed in the contact holes. A bit line BL may be formed over the bit line contacts BCT and the interlayer insulating layer ITL. The channel layers CH of the vertical plugs whose portions overlap with the first isolation pattern 1SP may be electrically coupled to the bit line BL through the bit line contacts BCT. As a result, the vertical plugs whose portions overlap with the first isolation pattern 1SP, as well as the vertical plugs that do not overlap with the first isolation pattern 1SP, may serve as normal plugs.

Figure 9:
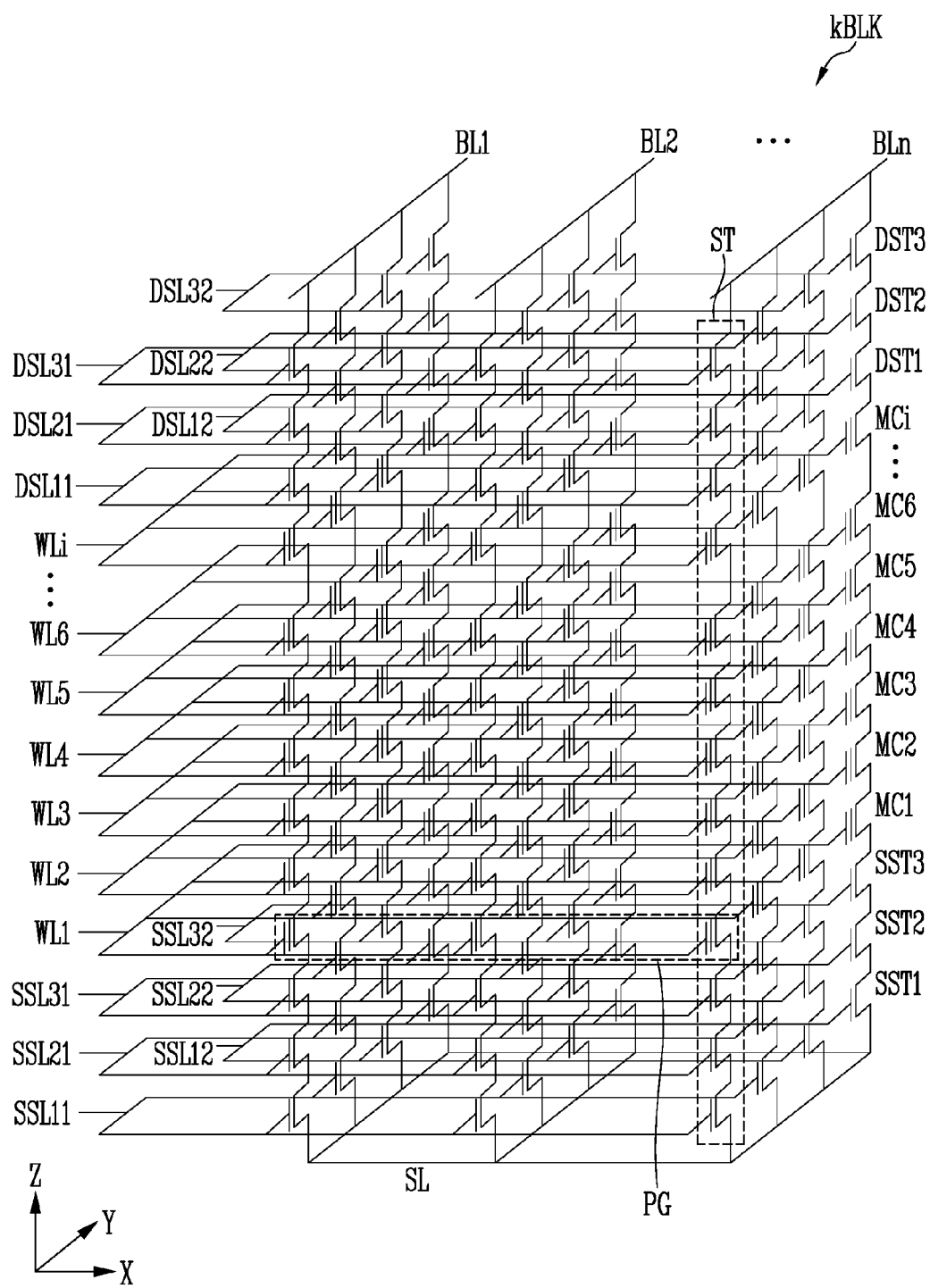
FIG. 9 is a circuit view of a memory block according to a second embodiment of the present disclosure.

FIG. 9 is a circuit view illustrating a memory block according to a second embodiment of the present disclosure.

Referring to FIG. 9, in the memory block according to the second embodiment, connections of all circuits, except for connections between source select lines, are the same as those of the circuits, shown in FIG. 3. Therefore, a description of the same circuit connections as shown in FIG. 3 is omitted, and the connections of the source select lines will be described below.

In the memory block according to the second embodiment, each of the source select lines may be separated into parts in the second direction (Y direction) in the same manner as each of the drain selection lines is separated into parts. For example, the first to third source select transistors SST1 to SST3 that are included in different strings ST may be coupled to the source select lines that are separated into parts by the second isolation pattern. More specifically, the first to third source select transistors SST1 to SST3 that are arranged in the first direction (X direction) may be coupled to the same source select line, and the first to third source select transistors SST1 to SST3 that are arranged in the second direction (Y direction) may be coupled to the source select lines that are separated into parts. For example, some of the first source select transistors SST1 may be coupled to the 11th source select line SSL11, and other first source select transistors SST1 may be coupled to the 12th source select line SSL12. The 12th source select line SSL12 may be spaced apart from the 11th source select line SSL11. Therefore, a voltage that is applied to the 11th source select line SSL11 may be different from a voltage that is applied to the 12th source select line SSL12. In this manner, some of the second drain select transistors SST2 may be coupled to the 21st source select line SSL21, and other second drain select transistors SST2 may be coupled to the 22nd source select line SSL22. Some of the third source select transistors SST3 may be coupled to the 31st source select line SSL31, and other third source select transistors SST3 may be coupled to the 32nd source select line SSL32.

Though not shown in FIG. 9, dummy lines may be arranged between the drain select line and the word line and between the source select line and the word line.

Figure 10:
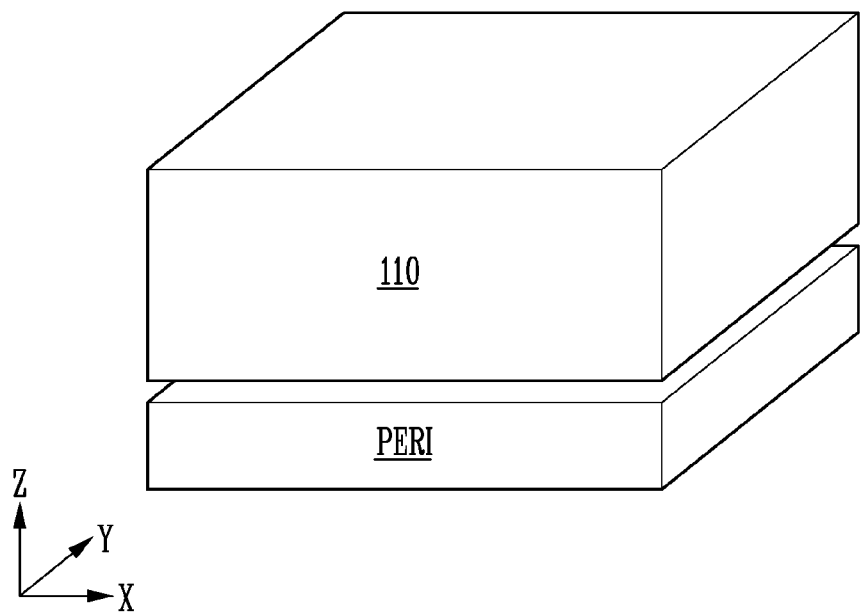
FIG. 10 is a perspective view illustrating the arrangement of a memory cell array and a peripheral circuit according to a second embodiment of the present disclosure.

FIG. 10 is a perspective view illustrating the arrangement of the memory cell array 110 and the peripheral circuits according to the second embodiment of the present disclosure.

Referring to FIG. 10, the memory cell array 110 may be located above a peripheral circuit structure PERI. The peripheral circuit structure PERI may be formed on the substrate. The memory cell array 110 may be formed in the third direction (Z direction) from the peripheral circuit structure PERI. In other words, the memory cell array 110 may be stacked on top of the peripheral circuit structure PERI. For example, the peripheral circuit structure PERI located under the memory cell array 110 may include a page buffer group or a row decoder.

Figure 11:
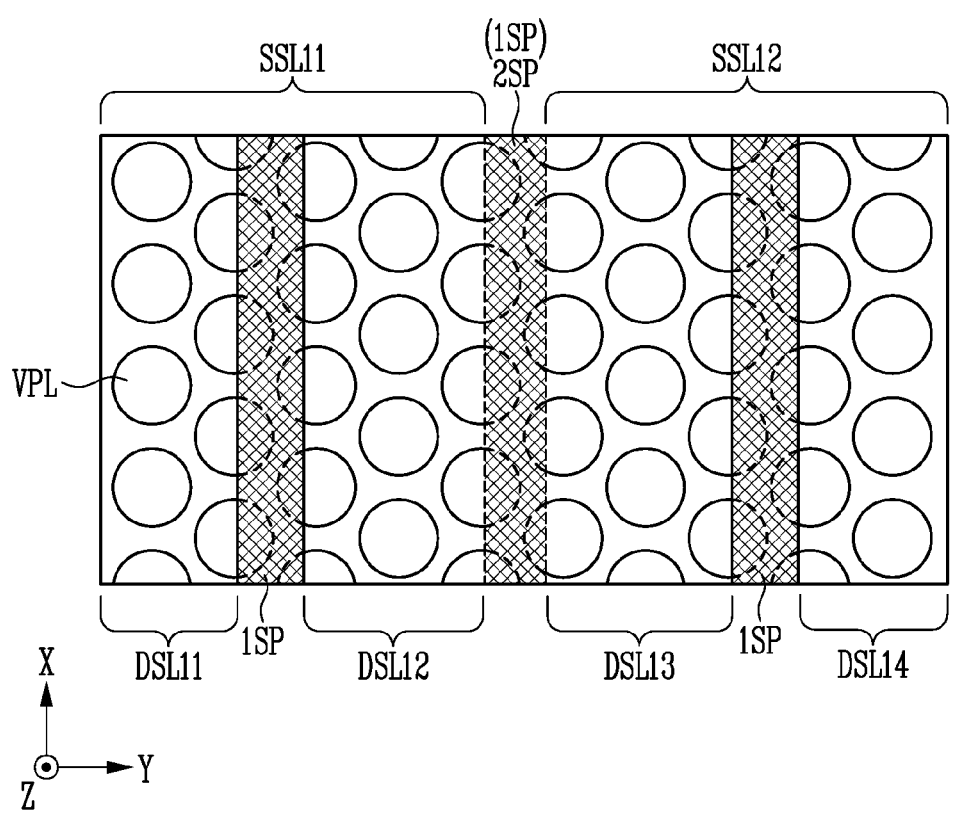
FIG. 11 is a plan view illustrating first and second isolation patterns according to a second embodiment of the present disclosure.

FIG. 11 is a diagram illustrating first and second isolation patterns according to the second embodiment of the present disclosure.

Referring to FIG. 11, the 11th, 12th, 13th and 14th drain select lines DSL11, DSL12, DSL13, and DSL14 that are formed on the same layer may be spaced apart from each other by the first isolation pattern 1SP, and the 11th and 12th source selectin lines SSL11 and SSL12 that are formed on the same layer may be spaced apart from each other by the second isolation pattern 2SP. For example, the first and second isolation patterns 1SP and 2SP may be formed in a linear shape that extends in the first direction (X direction) and may be spaced apart from each other in the second direction (Y direction).

The vertical plugs VPL in the memory block may be arranged in a zigzag pattern in the plane that is defined in the first and second directions (X and Y directions). The first and second isolation patterns 1SP and 2SP may overlap with some of the vertical plugs that are adjacent to each other in the first direction (X direction).

FIGS. 12A to 12H are diagrams illustrating a method of manufacturing a memory device according to the second embodiment of the present disclosure.

Figure 12A:
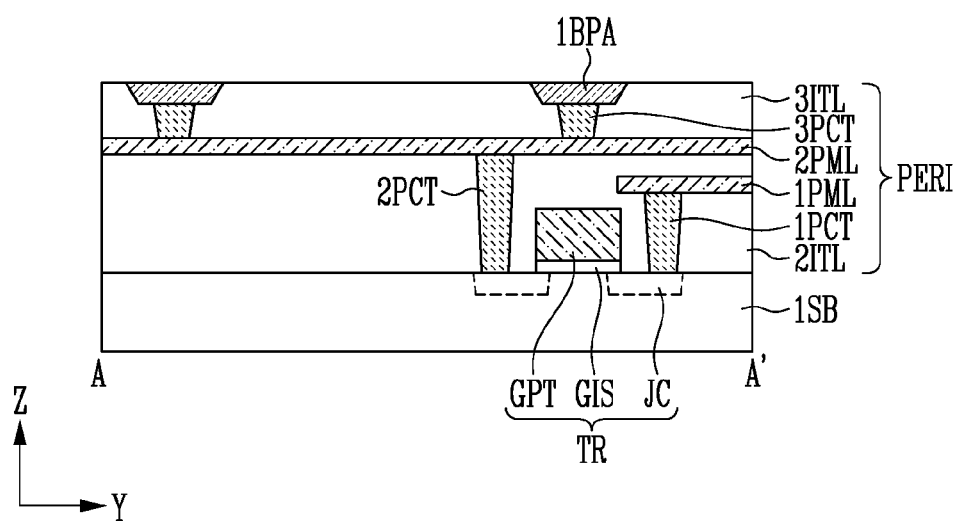
FIGS. 12A to 12H are diagrams illustrating a method of manufacturing a memory device according to a second embodiment of the present disclosure.

Referring to FIG. 12A, the peripheral circuit structure PERI may be formed on a first substrate 1SB. For example, the peripheral circuit structure PERI may include a transistor TR, and first to third peripheral contacts 1PCT to 3PCT, first and second peripheral lines 1PML and 2PML, and first bonding pads 1BPA that are configured to electrically couple the transistor TR to a cell structure (e.g., a memory block). The transistor TR of the peripheral circuit structure PERI may transmit various voltages to memory cells that are included in a memory cell array or may receive voltages or currents that are changed by the memory cells. For example, junction regions JC may be formed in the first substrate 1SB, and a gate insulating layer GIS and a gate conductive pattern GPT may be formed on the first substrate 1SB between the junction regions JC. The junction region JC, the gate insulating layer GIS, and the gate conductive pattern GPT may constitute the transistor TR. The first or second peripheral contacts 1PCT or 2PCT may be formed over the junction regions JC that are included in the transistor TR. The first peripheral line 1PML may be formed over the first peripheral contact 1PCT and the second peripheral line 2PML may be formed over the second peripheral contact 2PCT. The first peripheral line 1PML may be coupled to a voltage generator that is configured to supply power to the cell structure. The transistor TR, the first and second peripheral contacts 1PCT and 2PCT, and the first peripheral line 1PML may be formed in a second interlayer insulating layer 2ITL. The second peripheral line 2PML that contacts the second peripheral contact 2PCT may be formed over the second interlayer insulating layer 2ITL. A third interlayer insulating layer 3ITL may be formed over the second peripheral line 2PML. The third peripheral contacts 3PCT and the first bonding pads 1BPA may be formed in the third interlayer insulating layer 3ITL. For example, the third peripheral contacts 3PCT may be formed over the second peripheral line 2PML, and the first bonding pads 1BPA may be formed on top of the third peripheral contact 3PCT. The first bonding pads 1BPA may be provided to make the cell structure in contact with the peripheral circuit structure PERI. The first bonding pads 1BPA may include a high dielectric material that is electrifiable, or a conductive adhesive material. Examples of the conductive adhesive material may include a flowable material having a viscosity that is controlled by a solvent, such as acetone or alcohol, epoxy resin, or a composite including silver nano particles, boron nitride, and epoxy.

In addition to the structure, shown in FIG. 12A, the peripheral circuit structure PERI may include various structures that are included in peripheral circuits.

Figure 12B:
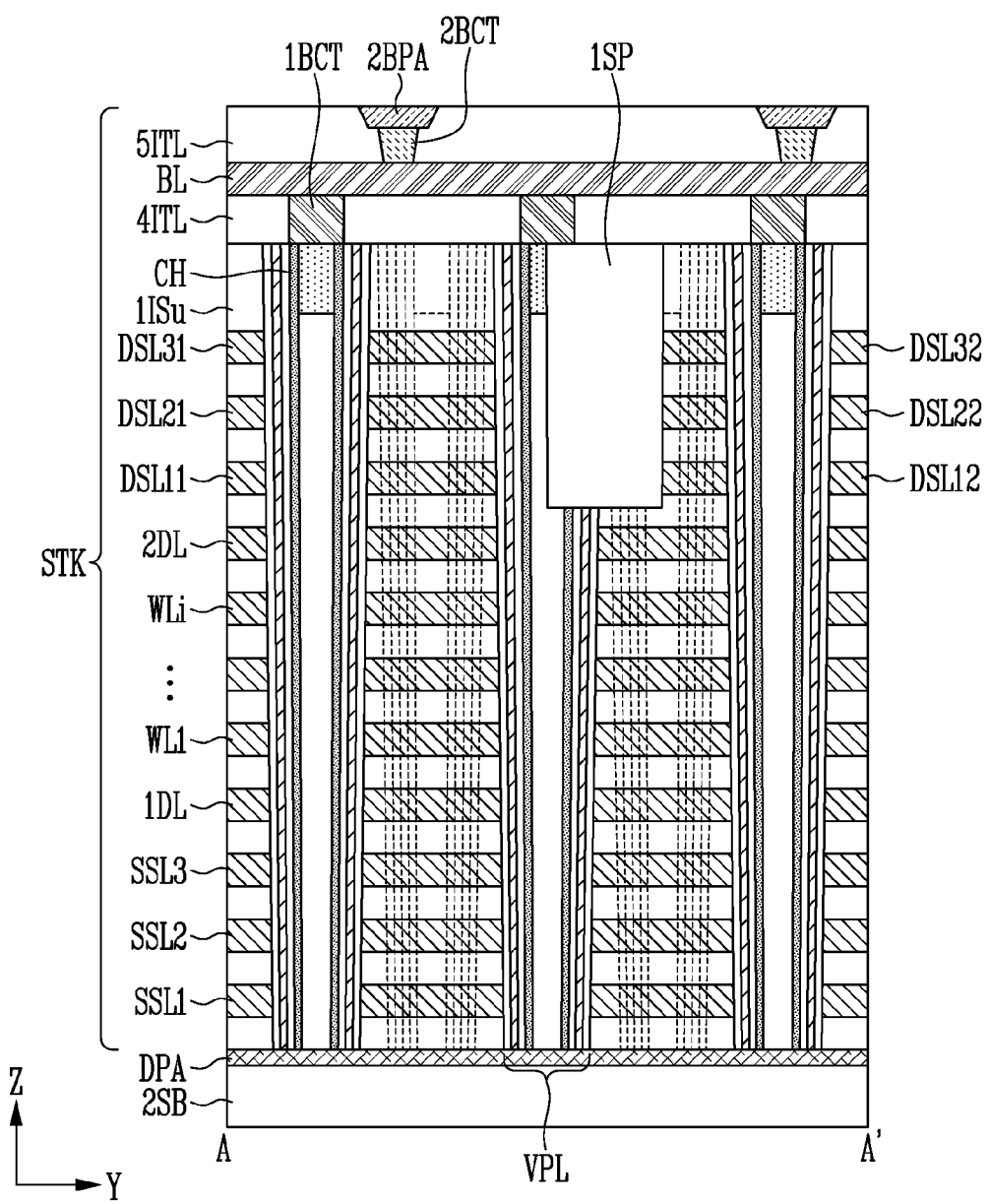

Referring to FIG. 12B, a cell structure STK that includes vertical pillars VPL and the first isolation pattern 1SP may be formed on a second substrate 2SB. An isolation pattern DPA may be formed between the second substrate 2SB and the cell structure STK. The isolation pattern DPA may include a layer that is used to easily separate the second substrate 2SB from the cell structure STK.

The cell structure STK may include the first to third source select lines SSL1 to SSL3, the first dummy line 1DL, the first to ith word lines WL1 to WLi, the second dummy line 2DL, and the first to third drain select lines DSL1 to DSL3 that are spaced apart from each other and stacked on the isolation pattern DPA, and the vertical plugs VPL that vertically pass through the first to third source select lines SSL1 to SSL3, the first dummy line 1DL, the first to ith word lines WL1 to WLi, the second dummy line 2DL, and the first to third drain select lines DSL1 to DSL3. The insulating layers IS may be formed between the first to third source select lines SSL1 to SSL3, the first dummy line 1DL, the first to ith word lines WL1 to WLi, the second dummy line 2DL, and the first to third drain select lines DSL1 to DSL3. The first to third source select lines SSL1 to SSL3, the first dummy line 1DL, the first to ith word lines WL1 to WLi, the second dummy line 2DL, and the first to third drain select lines DSL1 to DSL3 may include, but not limited to, a metal material, such as tungsten (W), molybdenum (Mo), cobalt (Co), and nickel (Ni), or a semiconductor material, such as silicon (Si) or polysilicon (Poly-Si). Each of the insulating layers IS may include an oxide layer or a silicon oxide layer.

A fourth interlayer insulating layer 4ITL and first bit line contacts 1BCT may be formed over the first upper insulating layer 1ISu, which is the uppermost insulating layer among the insulating layers IS, and the vertical plugs VPL. For example, the first bit line contacts 1BCT may contact the channel layer CH that is included in the vertical plugs VPL. The bit line BL may be formed over the fourth interlayer insulating layer 4ITL and the first bit line contacts 1BCT. A fifth interlayer insulating layer 5ITL, second bit line contacts 2BCT, and second bonding pads 2BPA may be formed over the bit line BL. For example, the second bit line contacts 2BCT may be formed over the bit line BL, and the second bonding pads 2BPA may be formed over the second bit line contacts 2BCT.

Figure 12C:
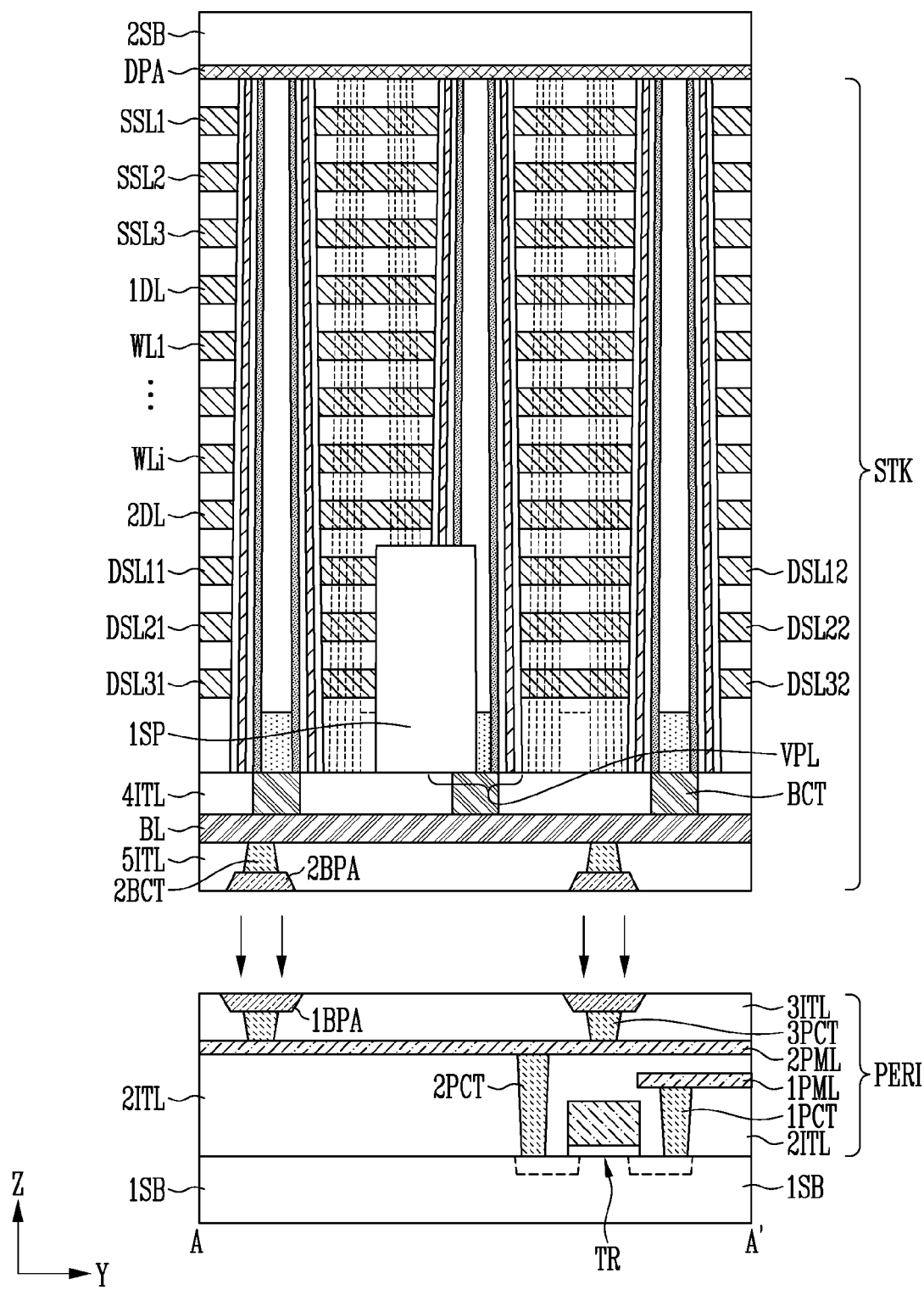

Referring to FIG. 12C, the cell structure STK, the isolation pattern DPA, and the second substrate 2SB may be turned over. The upside-down cell structure STK may then be bonded to the peripheral circuit structure PERI. More specifically, the second bonding pads 2BPA may be exposed at the lowermost bottom of the upside-down cell structure STK, and the first bonding pads 1BPA may be exposed at the uppermost part of the peripheral circuit structure PERI. For example, by bonding the first and second bonding pads 1BPA and 2BPA to each other, the cell structure STK and the peripheral circuit structure PERI may be bonded to each other.

Figure 12D:
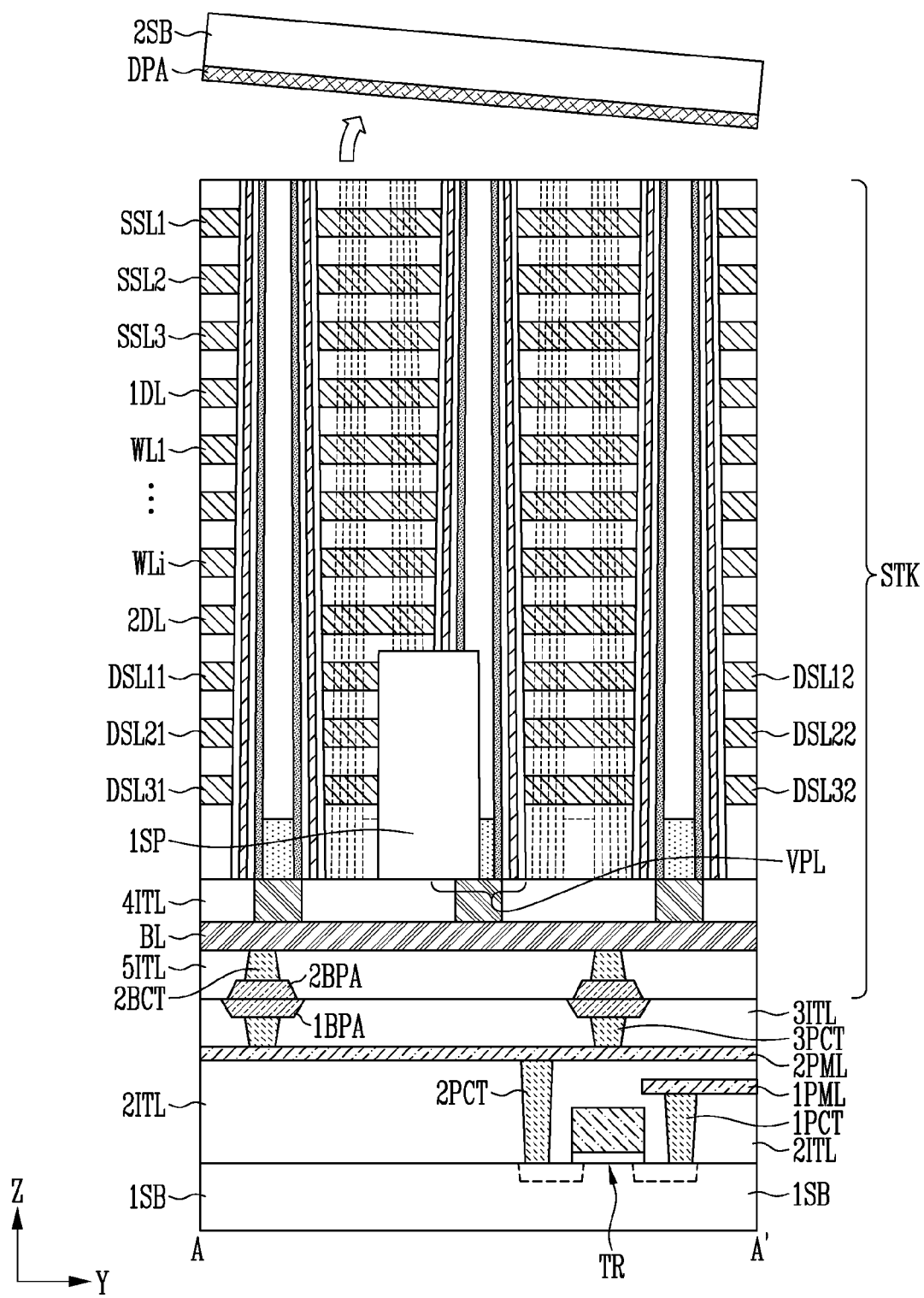

Referring to FIG. 12D, the second substrate 2SB and the isolation pattern DPA that are located on the top of the cell structure STK may be separated from the cell structure STK. For example, the second substrate 2SB may be removed, and the isolation pattern DPA that remains at the top of the cell structure STK may be removed by performing a cleaning or etch process.

Figure 12E:
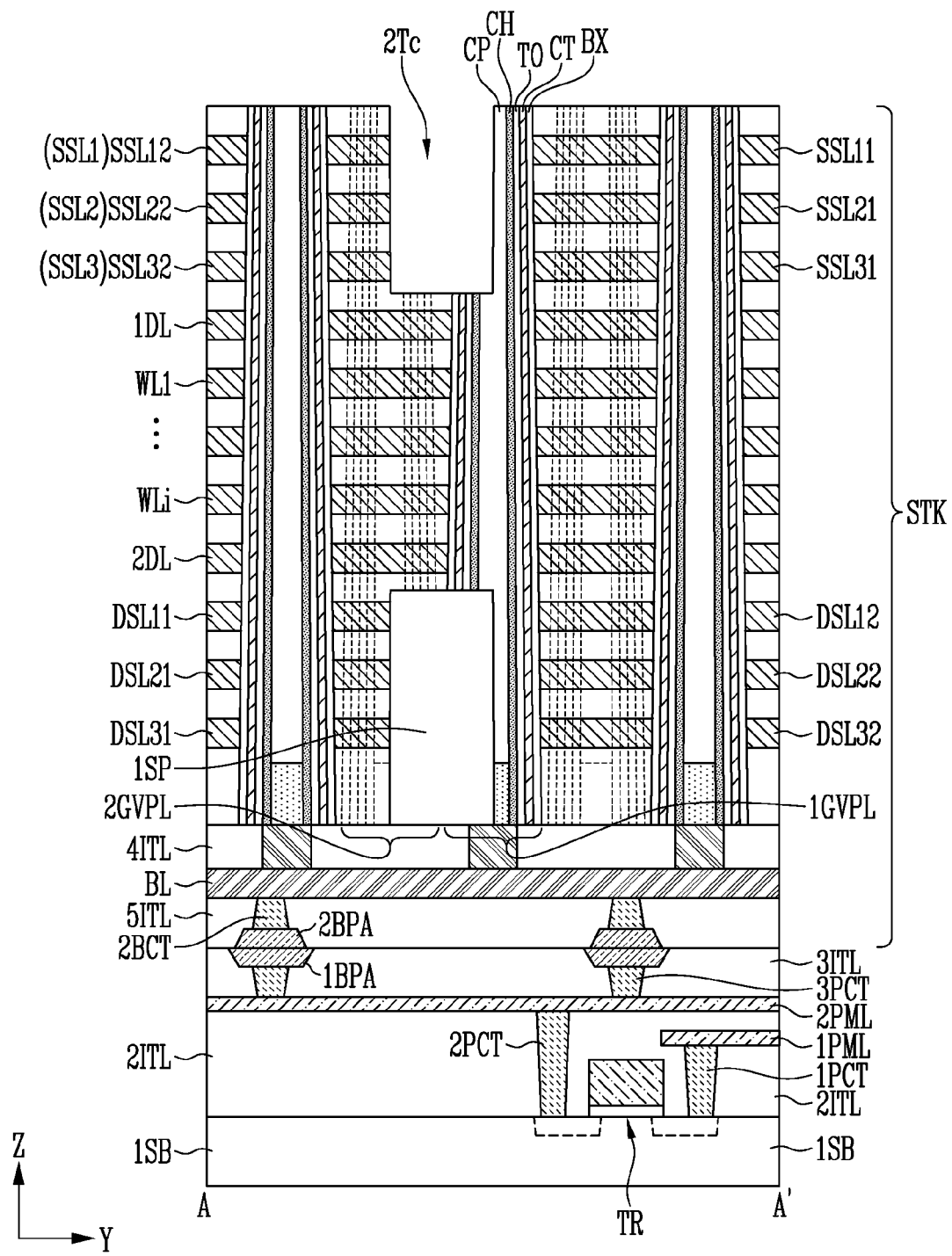

Referring to FIG. 12E, a second trench 2Tc may overlap with portions of the vertical plugs that are included in the first vertical plug group 1GVPL and the second vertical plug group 2GVPL, among the vertical plugs, which are adjacent to each other. For example, the second trench 2Tc may overlap with portions of the vertical plugs that are included in the first vertical plug group 1GVPL and portions of the vertical plugs that are included in the second vertical plug group 2GVPL. The second trench 2Tc may be formed by sequentially etching the structures formed in the upper parts of the vertical plugs. The etch process of forming the second trench 2Tc may be performed until the first to third source select lines SSL1 to SSL3 are separated in the second direction (Y direction) so that a portion of the channel layer CH that is included in the vertical plug may remain from top. The second trench 2Tc may be formed by partially etching the vertical plug. The core pillar CP, the channel layer CH, the tunnel isolation layer TO, the charge trap layer CT, and the blocking layer BX may be partially exposed through the side surface of the second trench 2Tc. Alternatively, the etch process of forming the second trench 2Tc may be performed until the first dummy line 1DL is separated.

The second trench 2Tc may be formed separate the first source select line SSL1 into the 11th and 12th source select lines SSL11 and SSL12, may separate the second source select line SSL2 into the 21st and 22nd source select lines SSL21 and SSL22, and may separate the third source select line SSL3 into the 31st and 32nd source select lines SSL31 and SSL32. The 11th, 21st, and 31st source select lines SSL11, SSL21, and SSL31 may be coupled to the vertical plugs that are included in the first vertical plug group 1GVPL. The 12th, 22nd, and 32nd source select lines SSL12, SSL22, and SSL32 may be coupled to the vertical plugs that are included in the second vertical plug group 2GVPL.

Figure 12F:
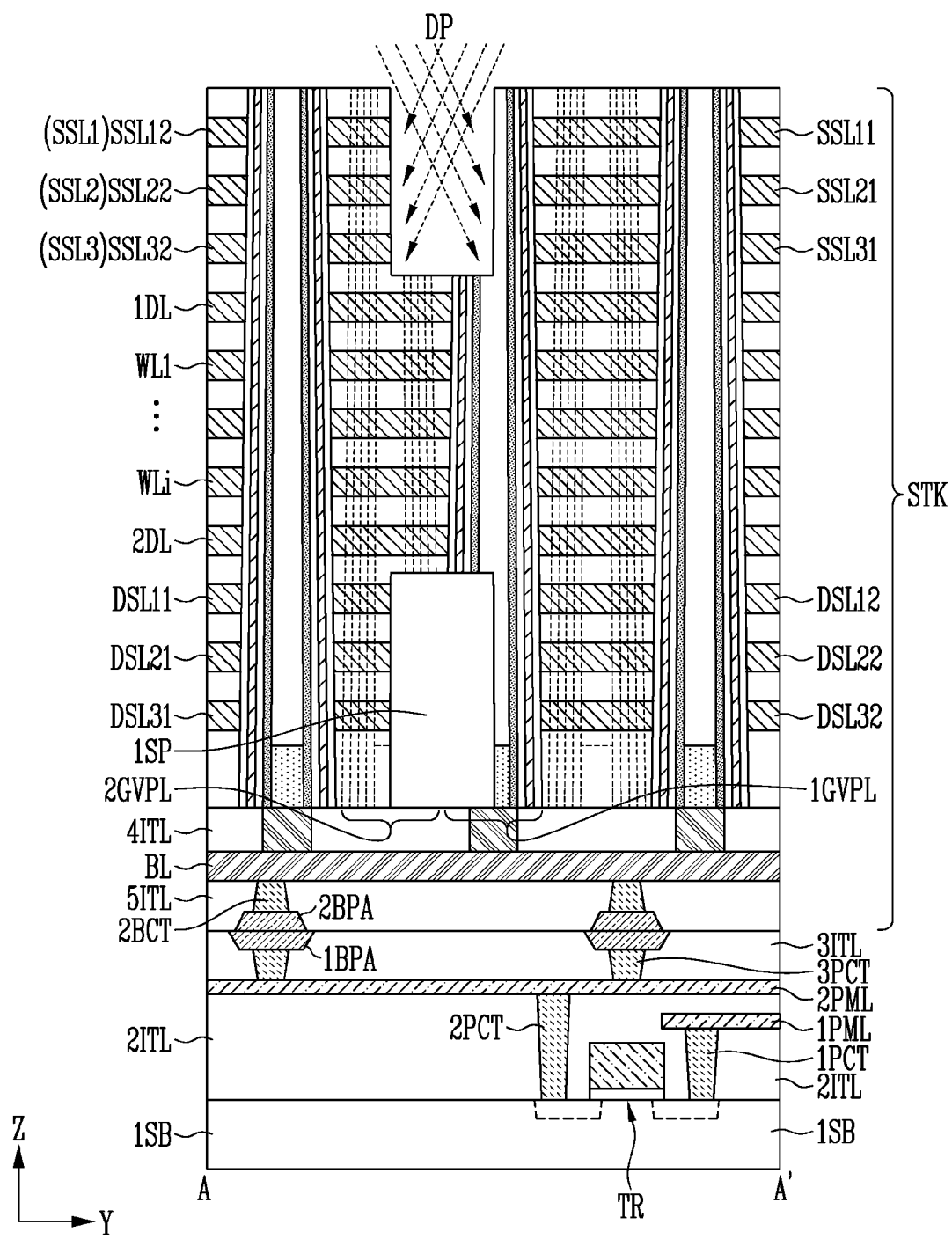

Referring to FIG. 12F, an impurity (DP) injection process may be performed on an inner surface of the second trench 2Tc. The impurity (DP) injection process may be performed to reduce a leakage current that may occur in the source select transistors that are included in the vertical plugs in which the second trench 2Tc is formed. For example, the impurity DP may be phosphorous, boron, argon, or arsenic ions. Other than these ions, various ions may be used for preventing a leakage current. The impurity (DP) injection process may be performed through a tilting method so as to uniformly inject the impurity DP into the inner surface of the second trench 2Tc. In the impurity (DP) injection process through the tilting method, an angle of incidence at which the impurity DP is injected might not be limited to 90 degrees with respect to the substrate. The impurity DP may be injected into a target layer at an angle of incidence that is greater or less than 90 degrees. Therefore, the impurity DP may be uniformly injected into the channel layer CH that is exposed through the side and bottom surfaces of the second trench 2Tc.

Figure 12G:
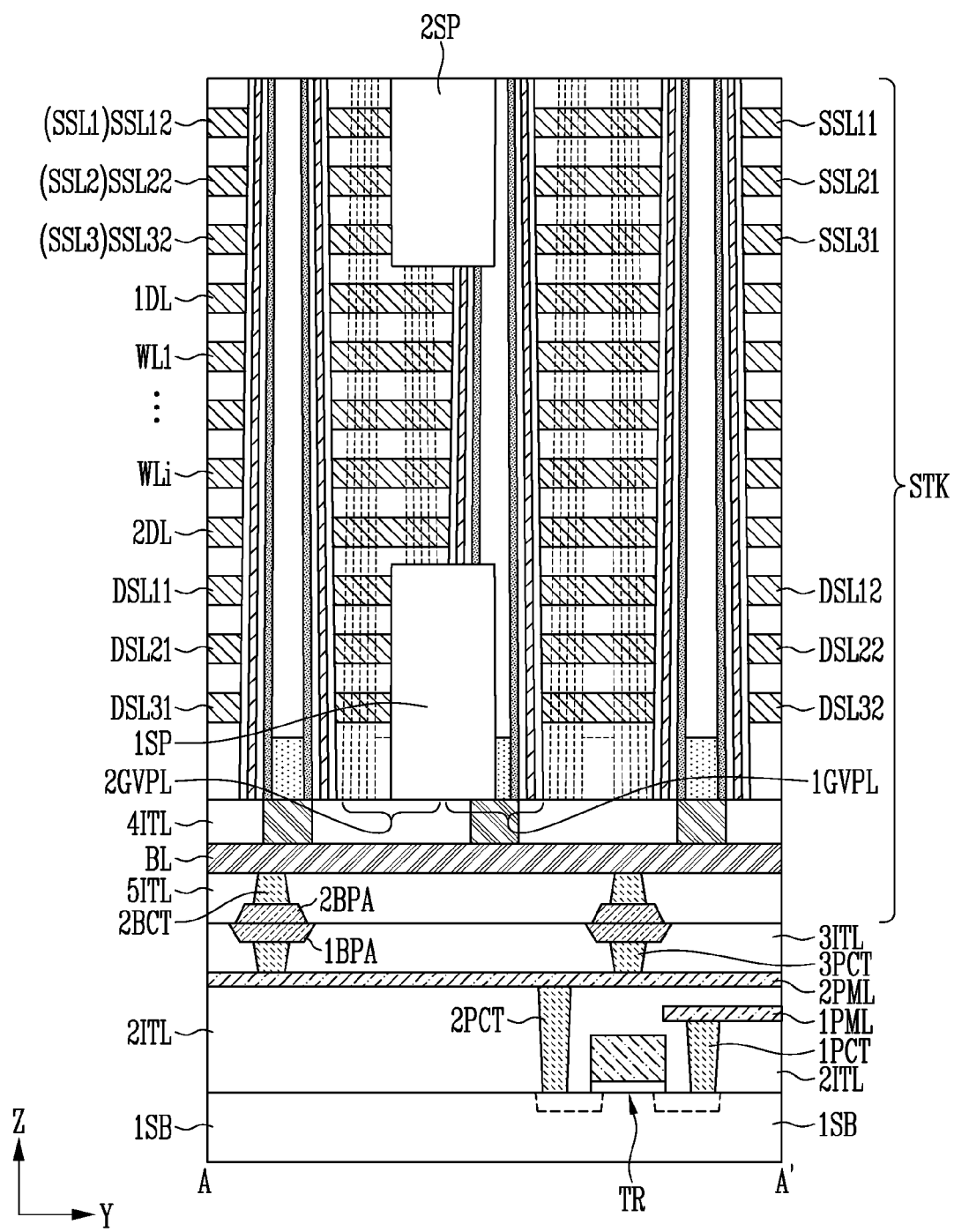

Referring to FIG. 12G, the second isolation pattern 2SP may be formed in the second trench 2Tc having the surface into which the impurity DP is injected. The second isolation pattern 2SP may include an insulating material, such as an oxide layer or a silicon oxide layer. For example, after an insulating material is coated over the entire structure including the second trench 2Tc, a planarizing process may be performed until a top surface of the vertical plug VPL is exposed, so that the second isolation pattern 2SP that remains in the second trench 2Tc may be formed.

Figure 12H:
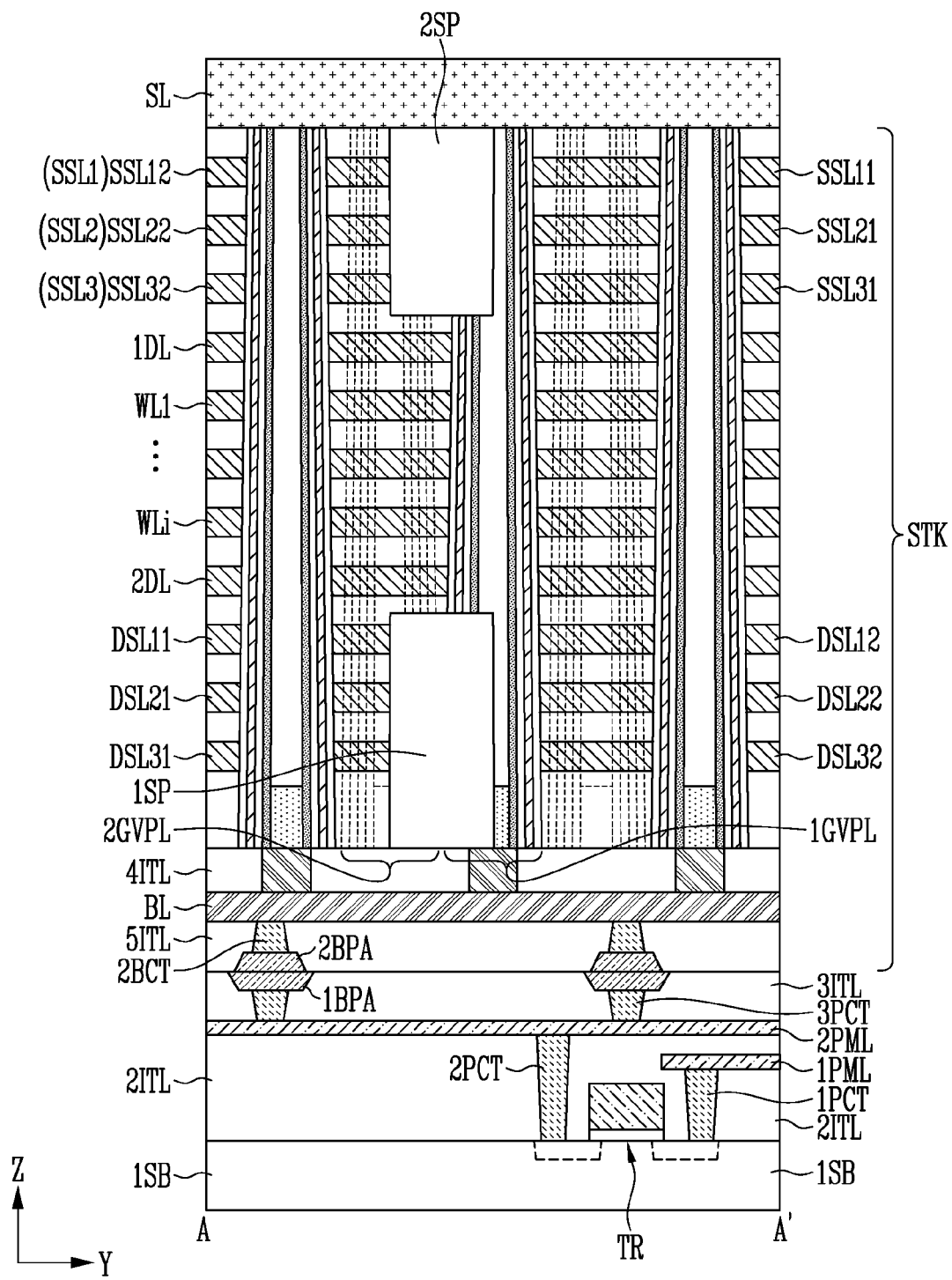

Referring to FIG. 12H, the source line SL may be formed over the entire structure including the second isolation pattern 2SP. The source line SL may include a conductive layer or a metal layer.

The channel layers CH of the vertical plugs having portions that overlap with the second isolation pattern 2SP, may be electrically coupled to the source line SL. Thus, the vertical plugs having portions that overlap with the second isolation pattern 2SP, as well as the vertical plugs that do not overlap with the second isolation pattern 2SP, may serve as normal plugs.

Figure 13:
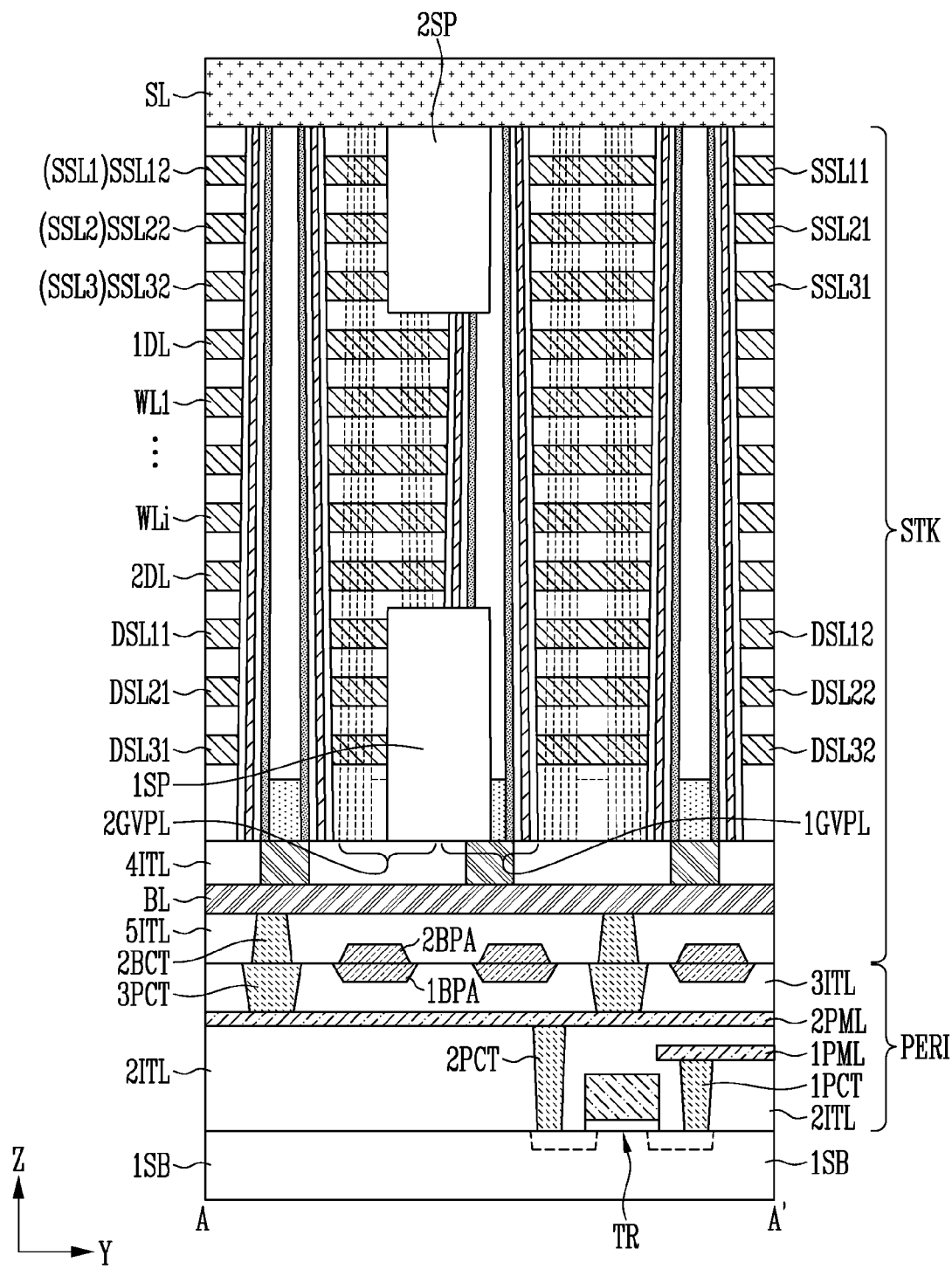
FIG. 13 is a diagram illustrating a memory device according to a third embodiment.

FIG. 13 is a diagram illustrating a memory device according to a third embodiment of the present disclosure.

Referring to FIG. 13, the first and second bonding pads 1BPA and 2BPA, through which the peripheral circuit structure PERI and the cell structure STK are in contact with each other, may be spaced apart from third peripheral contacts 3PCT and the second bit line contacts 2BCT. For example, the first bonding pads 1BPA may be spaced apart from the third peripheral contacts 3PCT in the third interlayer insulating layer 3ITL, and the second bonding pads 2BPA may be spaced apart from the second bit line contacts 2BCT in the fifth interlayer insulating layer 5ITL. When the first bonding pads 1BPA that are included in the peripheral circuit structure PERI and the second bonding pads 2BPA that are included in the cell structure STK contact each other, the third peripheral contacts 3PCT that are included in the peripheral circuit structure PERI may contact the second bit line contacts 2BCT that are included in the cell structure STK.

Referring to FIG. 13, the first isolation pattern 1SP may separate the 11th, 21st, and 31st drain select lines DSL11, DSL21, and DSL31 from the 12th, 22nd, and 32nd drain select lines DSL12, DSL22, and DSL32, respectively. Furthermore, the second isolation pattern 2SP may separate the 11th, 21st, and 31st source select lines SSL11, SSL21, and SSL31 from the 12th, 22nd, and 32nd source select lines SSL12, SSL22, and SSL32, respectively.

Figure 14:
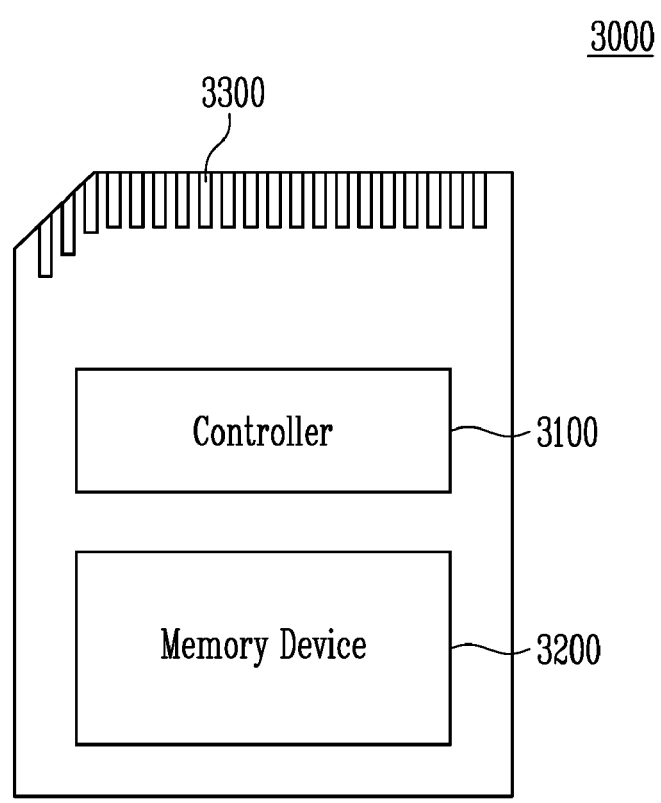
FIG. 14 is a diagram illustrating a memory card system to which a memory device according to the present disclosure is applied.

FIG. 14 is a block diagram illustrating a memory card system 3000 according to an embodiment of the present disclosure.

Referring to FIG. 14, the memory card system 3000 may include a controller 3100, a memory device 3200, and a connector 3300.

The controller 3100 may be coupled to the memory device 3200. The controller 3100 may access the memory device 3200. For example, the controller 3100 may control read, program, erase, and background operations of the memory device 3200. The controller 3100 may be configured to provide an interface between the memory device 3200 and the host. The controller 3100 may be configured to drive firmware for controlling the memory device 3200. In an embodiment, the controller 3100 may include components, such as a Random Access Memory (RAM), a processing unit, a host interface, a flash interface, and an ECC circuit.

The controller 3100 may communicate with an external device through the connector 3300. The controller 3100 may communicate with an external device (e.g., host) based on a specific communication protocol. In an embodiment, the controller 3100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe) protocols. In an embodiment, the connector 3300 may be defined by at least one of the above-described various communication protocols.

The memory device 3200 may include a plurality of memory cells and have the same configuration as the memory device 1100 as shown in FIG. 1.

The controller 3100 and the memory device 3200 may be integrated into a single semiconductor device to form a memory card. For example, the controller 3100 and the memory device 3200 may be integrated into a single semiconductor device to form a memory card, such as a personal computer memory card international association (PCMCIA) card, a compact flash (CF) card, a smart media card (SM or SMC), a memory stick, a multimedia card (MMC, RS-MMC, MMCmicro, or eMMC), an SD card (SD, miniSD, microSD, or SDHC), a universal flash storage (UFS), and the like.

Figure 15:
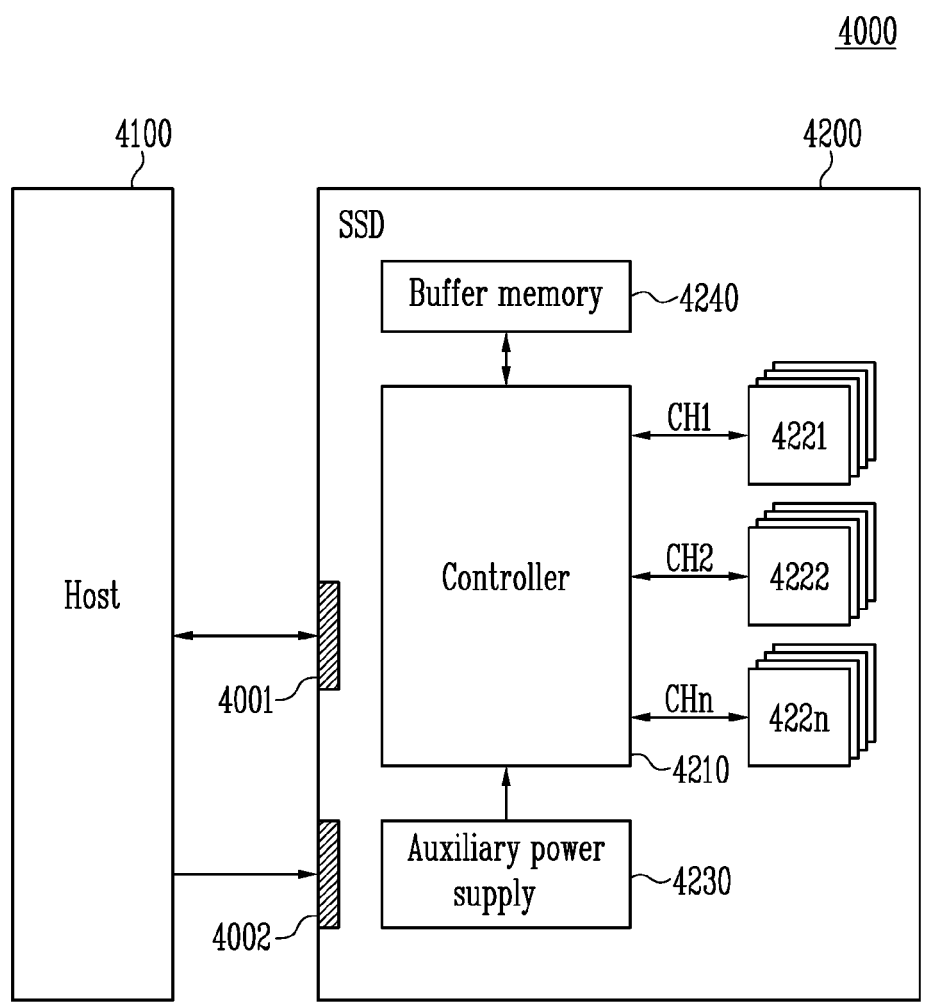
FIG. 15 is a diagram illustrating a solid state drive (SSD) system to which a memory device according to the present disclosure is applied.

FIG. 15 is a block diagram illustrating a solid state drive (SSD) system 4000 according to an embodiment of the present disclosure.

Referring to FIG. 15, the SSD system 4000 may include a host 4100 and an SSD 4200. The SSD 4200 may exchange signals with the host 4100 through a signal connector 4001 and may receive power through a power connector 4002. The SSD 4200 may include a controller 4210, a plurality of flash memories 4221 to 422n, an auxiliary power supply 4230, and a buffer memory 4240.

The controller 4210 may control the plurality of flash memories 4221 to 422n in response to the signals received from the host 4100. In an embodiment, the signals may be based on the interfaces of the host 4100 and the SSD 4200. For example, the signals may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe) interfaces.

The plurality of memory devices 4221 to 422n may include a plurality of memory cells configured to store data. Each of the plurality of memory devices 4221 to 422n may be configured in the same manner as the memory device 1100 as shown in FIG. 1. The plurality of memory devices 4221 to 422n may communicate with the controller 4210 through channels CH1 to CHn.

The auxiliary power supply 4230 may be coupled to the host 4100 through the power connector 4002. The auxiliary power supply 4230 may be supplied and charged with the power from the host 4100. The auxiliary power supply 4230 may supply the power of the SSD 4200 when the power is not smoothly supplied from the host 4100. In an embodiment, the auxiliary power supply 4230 may be positioned inside or outside the SSD 4200. For example, the auxiliary power supply 4230 may be disposed in a main board and supply auxiliary power to the SSD 4200.

The buffer memory 4240 may serve as a buffer memory of the SSD 4200. For example, the buffer memory 4240 may temporarily store data that is received from the host 4100 or data that is received from the plurality of flash memories 4221 to 422n, or may temporarily store metadata (e.g., mapping tables) of the flash memories 4221 to 422n. The buffer memory 4240 may include volatile memories such as DRAM, SDRAM, DDR SDRAM, LPDDR SDRAM, and GRAM, or nonvolatile memories such as FRAM, ReRAM, STT-MRAM, and PRAM.

According to the present disclosure, an isolation pattern of select lines may be formed without causing loss of a vertical plug, so that no loss of the vertical plug may prevent an increase in size of a memory device.

It will be apparent to those skilled in the art that various modifications can be made to any of the above-described embodiments of the present invention without departing from the spirit or scope of the invention. Thus, it is intended that the present invention cover all such modifications provided they come within the scope of the appended claims and their equivalents.

What is claimed is:

1. A memory device comprising:
   a first vertical plug and a second vertical plug;
   a first select line contacting the first vertical plug;
   a second select line disposed over the same layer as the first select line and contacting the second vertical plug;
   an isolation pattern overlapping with a portion of the first vertical plug and a portion of the second vertical plug and separating the first select line from the second select line; and
   impurity regions formed in the first vertical plug and the second vertical plug, the impurity regions disposed below the isolation pattern.

2. The memory device of claim 1, wherein each of the first and second vertical plugs includes select transistors and memory cells.

3. The memory device of claim 1, wherein each of the first and second vertical plugs comprises:
   a core pillar vertically passing through the first select line and the second select line;
   a channel layer surrounding a side surface of the core pillar;
   a tunnel isolation layer surrounding a side surface of the channel layer;
   a charge trap layer surrounding a side surface of the tunnel isolation layer; and
   a blocking layer surrounding a side surface of the charge trap layer.

4. The memory device of claim 3, wherein a portion of the channel layer is removed due to the isolation pattern; and
   wherein a remaining portion of the channel layer on the same layer as the removed portion remains at a portion that does not overlap with the isolation pattern.

5. The memory device of claim 1, further comprising:
word lines contacting the first vertical plug and the second vertical plug, the word lines stacked and separated from each other; and
a dummy line formed between the word line and the first select line or formed between the word line and the second select line.

6. The memory device of claim 5, wherein each of the word lines over the same layer is electrically coupled to each other.

7. The memory device of claim 5, wherein the dummy line over the same layer is separated into parts by the isolation pattern.

8. The memory device of claim 1, wherein the isolation pattern includes an insulating material.

9. A memory device comprising:
a source line, first select lines, word lines, and second select lines sequentially stacked over a substrate;
a first vertical plug and a second vertical plug vertically passing through the first select lines, the word lines, and the second select lines, and spaced apart from each other;
a first isolation pattern between the first vertical plug and the second vertical plug, overlapping with a portion of the first vertical plug and the second vertical plug and separating the first select lines; and
a second isolation pattern between the first vertical plug and the second vertical plug, overlapping with a portion of the first vertical plug and a portion of the second vertical plug, and separating the second select lines.

10. The memory device of claim 9, wherein each of the first and second vertical plugs comprises:
a core pillar;
a channel layer surrounding a side surface of the core pillar;
a tunnel isolation layer surrounding an outer side surface of the channel layer;
a charge trap layer surrounding an outer side surface of the tunnel isolation layer; and
a blocking layer surrounding an outer side surface of the charge trap layer.

11. The memory device of claim 10,
wherein the core pillar, the channel layer, the tunnel isolation layer, the charge trap layer, and the blocking layer of the first vertical plug and the second vertical plug are removed from portions that overlap with the first isolation pattern; and
wherein remaining portions of the core pillar, the channel layer, the tunnel isolation layer, the charge trap layer, and the blocking layer of the first and second vertical plugs over the same layer as the removed portions remain at portions that do not overlap with the first isolation pattern.

12. The memory device of claim 11, further comprising:
a bit line contact provided over the remaining portions of the channel layer; and
a bit line provided over the bit line contact.

13. The memory device of claim 9, wherein the word lines are commonly coupled to the first vertical plug and the second vertical plug.

14. The memory device of claim 9, wherein the first select lines, separated by the first isolation pattern, are electrically insulated from each other.

15. A memory device comprising:
a peripheral circuit structure over a substrate;
a cell structure contacting the peripheral circuit structure through bonding pads, and including a bit line, first select lines, word lines, second select lines, and a source line;
a first vertical plug and a second vertical plug vertically penetrating the cell structure, the first vertical plug spaced apart from the second vertical plug;
a first isolation pattern overlapping with portions of the first and second vertical plugs and separating the first select lines; and
a second isolation pattern overlapping with portions of the first and second vertical plugs, and separating the second select lines;
wherein the first isolation pattern is vertically spaced apart from the second isolation pattern with the word lines interposed therebetween.

16. The memory device of claim 15, wherein each of the first and second vertical plugs comprises:
a core pillar;
a channel layer surrounding a side surface of the core pillar;
a tunnel isolation layer surrounding an outer side surface of the channel layer;
a charge trap layer surrounding an outer side surface of the tunnel isolation layer; and
a blocking layer surrounding an outer side surface of the charge trap layer.

17. The memory device of claim 16,
wherein a portion of the channel layer that is adjacent to the first isolation pattern is electrically coupled to the bit line, and
wherein a portion of the channel layer that is adjacent to the second isolation pattern is electrically coupled to the source line.

18. The memory device of claim 15, wherein the first and second isolation patterns include an insulating material.

19. The memory device of claim 15, wherein the word lines are commonly coupled to the first and second vertical plugs.

20. The memory device of claim 15, further comprising an impurity injected into a surface where the first and second vertical plugs contact the first or second isolation pattern.

* * * * *